(12) United States Patent
Tracy et al.

(10) Patent No.: US 7,633,759 B2
(45) Date of Patent: Dec. 15, 2009

(54) POWER MODULE CONNECTION ASSEMBLIES AND UNIVERSAL POWER SUPPLIES AND METHODS INCLUDING THE SAME

(75) Inventors: John Gaylord Tracy, Hendersonville, NC (US); Larry Van Lynam, Youngsville, NC (US)

(73) Assignee: Eaton Power Quality Corporation, Cleveland, OH (US)

( * ) Notice: Subject to any disclaimer, the term of this patent is extended or adjusted under 35 U.S.C. 154(b) by 120 days.

(21) Appl. No.: 11/561,458

(22) Filed: Nov. 20, 2006

(65) Prior Publication Data

US 2007/0212910 A1    Sep. 13, 2007

Related U.S. Application Data

(60) Provisional application No. 60/781,094, filed on Mar. 10, 2006.

(51) Int. Cl.
*H05K 7/16* (2006.01)

(52) U.S. Cl. ...................................... 361/727; 439/259

(58) Field of Classification Search ................ 439/259, 439/260; 361/726, 727
See application file for complete search history.

(56) References Cited

U.S. PATENT DOCUMENTS

| | | | | |
|---|---|---|---|---|
| 3,636,499 A | * | 1/1972 | Winklebleck | 439/260 |
| 3,665,370 A | * | 5/1972 | Hartmann | 439/260 |
| 3,793,609 A | * | 2/1974 | McIver | 439/267 |
| 4,553,803 A | * | 11/1985 | Lapraik et al. | 439/260 |
| 4,606,594 A | * | 8/1986 | Grabbe et al. | 439/267 |
| 4,720,156 A | * | 1/1988 | Beers | 439/260 |
| 4,834,665 A | * | 5/1989 | Kreinberg et al. | 439/260 |
| 4,846,730 A | * | 7/1989 | Owen | 439/260 |
| 6,688,902 B1 | * | 2/2004 | Yoon et al. | 439/260 |

* cited by examiner

*Primary Examiner*—Thanh-Tam T Le
(74) *Attorney, Agent, or Firm*—Myers Bigel Sibley & Sajovec

(57) ABSTRACT

Power module connection assemblies include a longitudinally extending channel member and cam member. The longitudinally extending channel member includes a first end of a connector member in a sidewall thereof having a face exposed to an interior channel of the channel member. The connector member has an electrical connection section on a second end of the connector member, the second end being displaced from the first end. The longitudinally extending cam member is configured to be positioned in the channel of the channel member. The cam member is rotatably movable within the channel from a first position, wherein a mating connector bar may be received in the channel of the channel member proximate the first end of the connector member, to a second position to press the mating connector bar and the first end of the connector member together.

35 Claims, 16 Drawing Sheets

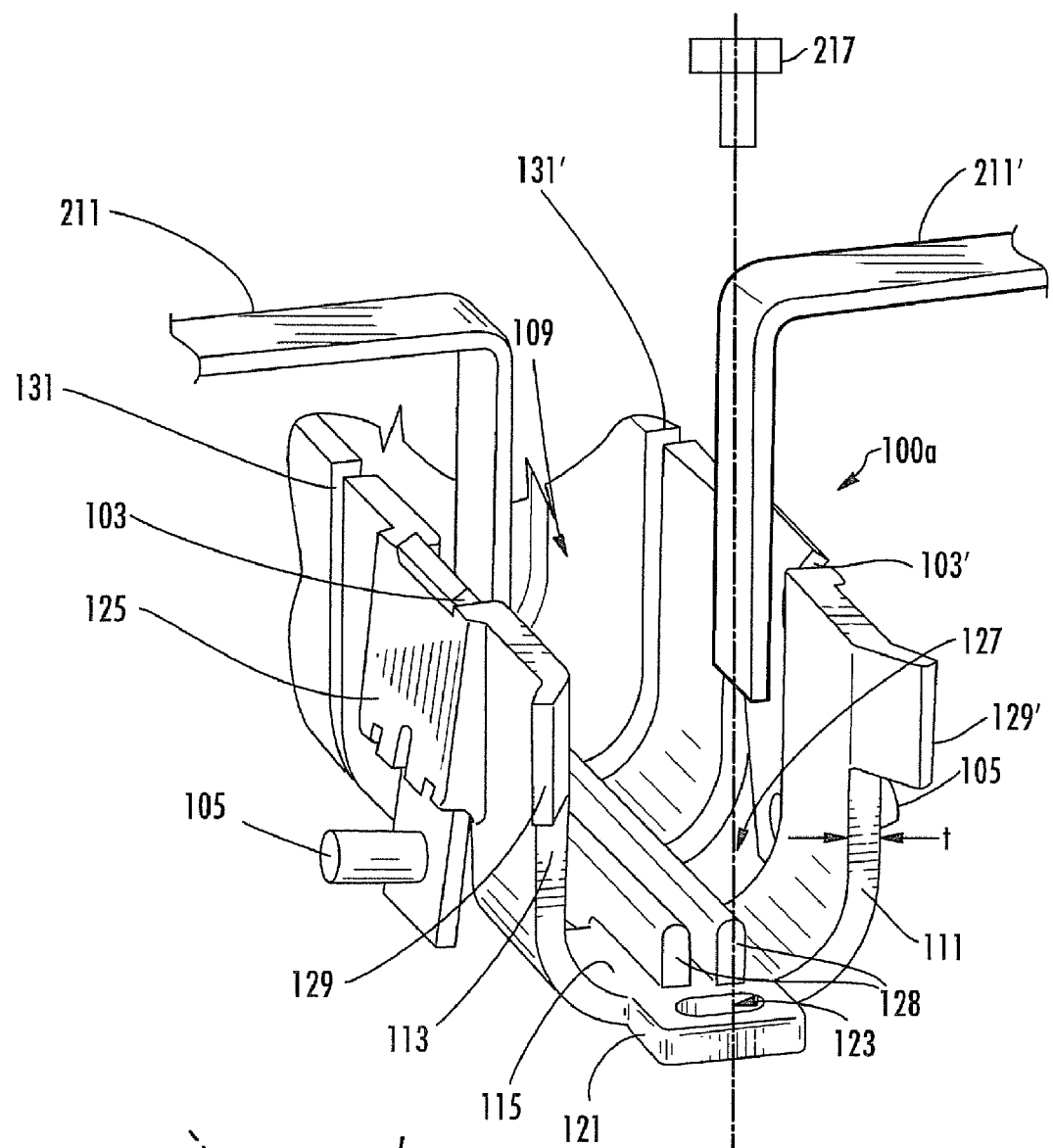
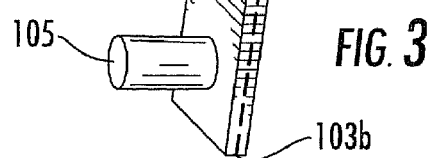
FIG. 2
FIG. 3

POWER MODULE CONNECTION ASSEMBLIES AND UNIVERSAL POWER SUPPLIES AND METHODS INCLUDING THE SAME

RELATED APPLICATIONS

The present application claims priority from U.S. Provisional Application No. 60/781,094, filed Mar. 10, 2006, the disclosure of which is hereby incorporated herein in its entirety by reference.

BACKGROUND OF THE INVENTION

The present invention relates to connection assemblies and, more particularly, to power module connection assemblies and methods of using the same.

A power conversion device, such as a three phase uninterruptible power supply (UPS), may include multiple power conversion circuits or other electronics that may be included in a removable power module. For example, an online UPS may include a rectifier that is used to rectify an input AC voltage to generate a DC voltage and an inverter that generates an AC voltage from this DC voltage. The UPS may also include additional power conversion circuits, such as battery charger and/or converter circuits, that may be included in a removable power module or in a power cabinet in which the power module is received. Electrical connections generally must then be made between components in the installed power module and components in the power cabinet.

The electrical connections between the power module and the components in the power cabinet are typically high current connections. Accordingly, a reliable connection for handling such current loads should be provided and, generally, cooling is provided as the connecting pieces may be heated by flow of current during operation of the UPS. To provide for a reliable electrical connection, a high insertion force connector or a mechanical connector, such as a lug and bolt arrangement, is typically used for the connections between the power module and the components in the power cabinet.

The use of connectors, such as described above, may further increase the complexity of assembling the various connections within the power cabinet, particularly as a large number of such connections generally must be made, not all of which are conveniently located and accessible from a front face of the power cabinet. As such, power cabinets typically include multiple cables extending from an otherwise inaccessible component to the front face of the power cabinet where connections to cables extending from an installed power module may then be made. In addition to increasing the number of connection points, this approach may result in a more cluttered interior of the power cabinet due to the volume of cabling passing through the interior of the power cabinet.

SUMMARY OF THE INVENTION

Embodiments of the present invention provide power module connection assemblies including a longitudinally extending channel member and cam member. The longitudinally extending channel member includes a first end of a connector member in a sidewall thereof having a face exposed to an interior channel of the channel member. The connector member has an electrical connection section on a second end of the connector member, the second end being displaced from the first end. The longitudinally extending cam member is configured to be positioned in the channel of the channel member. The cam member is rotatably movable within the channel from a first position, wherein a mating connector bar may be received in the channel of the channel member proximate the first end of the connector member, to a second position to press the mating connector bar and the first end of the connector member together.

In other embodiments, in the second position, the cam member deflects one of the mating connector bar and the first end of the connector member towards the other of the first end of the connector member and the mating connector bar. The cam member may be rotatably connected to a power module or the channel member may be coupled to the power module. The power module is configured to be received in a power cabinet including the other of the cam member or the channel member with the cam member in the channel when the cam member is in the first position. The cam member may be rotatably connected to the power module and the channel member may be configured to be coupled to a power cabinet and the power module may be configured to be received in the power cabinet with the cam member in the channel when the cam member is in the first position. The power module may be configured to be longitudinally slidably receivable in the power cabinet.

In further embodiments, the first end of the connector member has first portion extending at an angle from second portion to define a contact region therebetween. The first end of connector member is positioned in channel member so that the contact region contacts the mating connector bar and the first and second portion do not contact the mating connector bar in the second position. The channel member may further include a longitudinal position reference portion and the cam member may include a mating portion and the longitudinal position reference portion and the mating portion may limit rotation of the cam member from the first position to the second position when the cam member is not in a longitudinal position in the channel member defined by the longitudinal reference portion. The longitudinal reference portion may be a slot in the channel member and the mating portion may be a tab extending from the cam member into the slot when the cam member is in the longitudinal position in the channel member defined by the longitudinal reference portion. The longitudinal reference portion and the mating portion may further be configured to limit longitudinal movement of the cam member in the channel when the cam member is not in the first position.

In other embodiments a travel limiter is provided on the cam member that is configured to limit rotational movement of the cam member beyond the second position. The cam member may be rotationally mounted in a frame and the travel limiter may be an extension member extending from an end of the cam member that is received in a corresponding opening in the frame, the opening having a first end corresponding to the first position and a second end corresponding to the second position.

In further embodiments, a drive member is provided on an end of the cam member and is configured to receive a tool and transmit a torsional force from the tool to the cam member to rotate the cam member between the first position and the second position. The cam member may be a molded member and the tool may be integrally molded with the cam member. A switch may be coupled to prevent energizing of the power module when the cam member is not in the second position.

In yet further embodiments, the cam member and the channel member are longitudinally self-aligning when the cam member is inserted in the channel member. The cam member and/or the channel member may be connected to the power module or power cabinet, respectively, so as to allow angular movement about a longitudinal axis of the cam member and/ or channel member to longitudinally self-align the cam member and the channel member when the cam member is inserted in the channel member.

In other embodiments, the channel member includes a plurality of longitudinally spaced connector members in respective sidewalls thereof and a plurality of mating connector bars may be received in the channel of the channel member proximate corresponding ones of the plurality of connector members and pressed together therewith responsive to rotation of the cam member from the first position to the second position. Ones of the connector members may be arranged in a paired arrangement on opposite sidewalls of the channel member at respective longitudinal positions so that transverse forces on the cam member pressing the connector members and mating connector bars together are substantially offsetting.

In other embodiments, in the second position, the cam member deflects one of the mating connector bar and the first end of the connector member towards the other of the first end of the connector member and the mating connector bar and sidewalls of the channel have a spring characteristic selected to provide a desired force responsive to deflection of the one of the mating connector bar and the first end of the connector member in the second position. The spring characteristic may be provided by a material and a sidewall thickness of the channel member and a height of a contact region of the connector member where the connector member contacts the mating connector bar relative to a bottom surface of the channel member. The cam member may have a spring characteristic selected to provide a desired force responsive to deflection of the one of the mating connector bar and the first end of the connector member in the second position. The spring characteristic of the cam member may be provided by a spring member mounted in the cam member.

In yet further embodiments, universal power supplies include a power cabinet and a power module removably coupled to the power cabinet. A power module connection assembly that couples the power module to the power cabinet includes a longitudinally extending channel member and a longitudinally extending cam member. The longitudinally extending channel member is coupled to one of the power cabinet or the power module. The channel member includes a first end of each of a plurality of connector members at longitudinally spaced positions in a sidewall thereof, each of the first ends having a face exposed to an interior channel of the channel member. The connector members have an electrical connection section on a second end of the connector members, the second end being displaced from the first end. The longitudinally extending cam member is coupled to the other of the power cabinet or the power module. The cam member is configured to be positioned in the channel of the channel member and is rotatably movable within the channel from a first position, wherein a plurality of mating connector bars may be received in the channel of the channel member proximate the first ends of the connector members, to a second position to press the mating connector bars and the first ends of the connector members together.

In other embodiments, the channel member is coupled to the power cabinet and the power cabinet includes a plurality of inductors electrically coupled to the electrical connection sections on the second ends of ones of the connector members. The power module includes a printed circuit board and the mating connector bars are bus bars extending from the printed circuit board and/or crimped lugs on ends of wires extending from the printed circuit board.

In further embodiments, the channel member extends from a front face to a rear face of the power cabinet and the cam member is longitudinally slidably receivable in the channel member to receive the power module in the power cabinet. The power cabinet may be configured to receive a plurality of power modules, each having an associated power module connection assembly for slidably receiving the respective power module in the power cabinet. The uninterruptible power supply may further include a plurality of inductors, electrically coupled to the electrical connection sections of the second ends of ones of the connector members and positioned below the power module connection assembly and the power module and may further include a cooling fan positioned below the inductors that provides cooling for the inductors and for the power module connection assembly. The cam member may include a lockout feature extending therefrom that impedes closure of a front panel of the power cabinet when the cam member is not in the second position.

In yet further embodiments, methods of configuring a uninterruptible power supply include providing a power cabinet including components of the uninterruptible power supply and including one of a longitudinally extending channel member or a longitudinally extending cam member therein, the longitudinally extending channel member including a first end of each of a plurality of connector members at longitudinally spaced positions in a sidewall thereof, each of the first ends having a face exposed to an interior channel of the channel member, the connector members having an electrical connection section on a second end of the connector members, the second end being displaced from the first end, and the longitudinally extending cam member being configured to be positioned in the channel of the channel member, the cam member being rotatably movable within the channel. A power module is provided including the other of the longitudinally extending channel member or the longitudinally extending cam member therein. The power module is installed in the power cabinet with the cam member in the channel in a first rotational position with a plurality of mating connector bars extending from the one of the power module and the power cabinet having the cam member coupled thereto received in the channel of the channel member proximate the first ends of the connector members. The cam member is rotated to a second rotational position to press the mating connector bars and the first ends of the connector members together.

BRIEF DESCRIPTION OF THE DRAWINGS

FIG. 2 is a perspective view of an end portion of the channel member of FIG. 1 with mating connector bars received within the channel member.

FIG. 3 is a perspective view of a connector member for use in the channel member of FIG. 1 according to some embodiments of the present invention.

DETAILED DESCRIPTION

Figure 1:
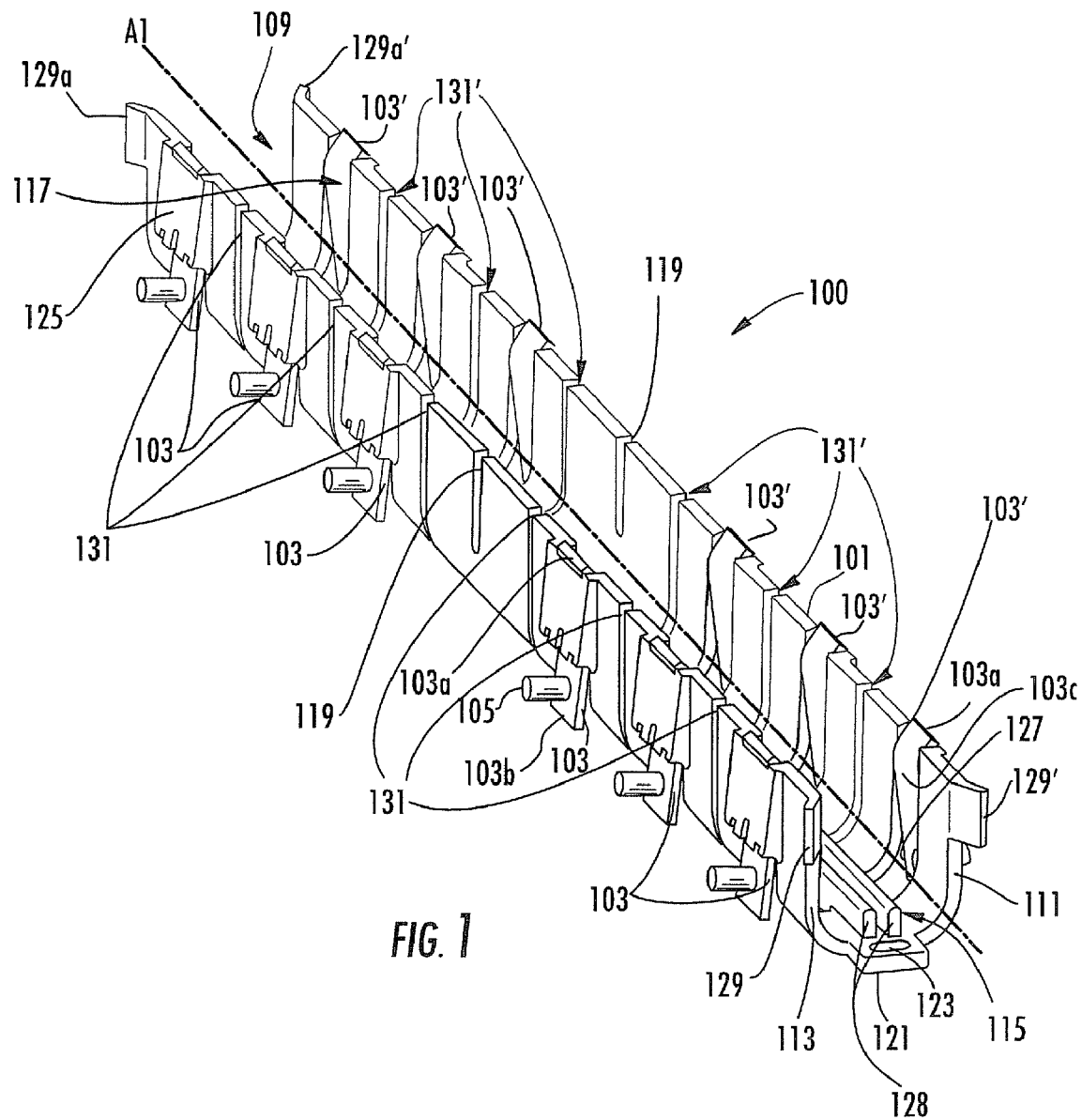
FIG. 1 is a perspective view of a channel member according to some embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Power module connection assemblies and universal power supplies including the same according to some embodiments of the present invention will now be described with reference to the FIGS. 1-18. A channel member will first be described with reference to FIGS. 1-3.

FIGS. 1, 2, 3 illustrate a longitudinally extending channel member assembly 100 according to some embodiments of the present invention. The channel member assembly 100 includes a U-shaped channel member 101 including a plurality of connector members 103, 103' positioned therein. More particularly, the channel member 101 includes two sidewalls 111, 113 connected by bottom surface 115. The channel member 101 defines a longitudinally extending channel 109 therein. The longitudinal axis $A_1$ of the channel member assembly 100 is also illustrated in FIG. 1.

A first end 103a of each of the connector members 103, 103' is positioned in a sidewall 113, 111 of the channel member 101 with a face 117 thereof exposed to an interior of the channel 109. The connector members 103, 103' are positioned in the channel 109 so as to be proximate mating connector bars 211, 211' received in the channel 109 of the channel member 101 proximate the first end 103a of the connector members 103, 103'. Note that, while the mating connector bars 211, 211' are shown as being received in the channel 109 inside of the connector members 103, 103', in some embodiments of the present invention, the orientation may be reversed and the mating connector bars 211, 211' may be received within the interior channel 109 in a position proximate but outside of the connector members 103, 103'

As seen in FIG. 3, in some embodiments of the present invention, the connector member 103 includes a first end 103a positioned in the channel member 101 and a second end 103b, displaced from the first end 103a with an electrical connection section, shown as bus studs 105 in FIG. 3. The bus studs 105 are configured to provide an electrical connection to a lug end of a conductor or the like extending from electrical components, such as inductors, located in a power cabinet or removable power module to be inserted in the power cabinet. The first end 103a of the connector 103 has a first portion extending at an angle α from a second portion to define a contact region 103c therebetween. The first end 103a of the connector member 103 is positioned in the channel member 101 so that the contact region 103c contacts the mating connector bars 211, 211' and the first and second portions do not contact the mating connector bar 211, 211' in a secured or closed position as will be described further herein and can be seen in FIG. 15.

Also shown in the embodiments of the channel member 101 of FIG. 1, is a slot 119, shown in each of the sidewalls 111, 113 in embodiments of FIG. 1. As will be described further later herein, the slots 119 provide a longitudinal reference. In addition, each of the sidewalls 111, 113 includes a plurality of slots 131, 131' defining a plurality of longitudinally spaced connector portions 100a in the channel member 101. In each of the longitudinally spaced connector portions 100a, a pair of connector members 103, 103a are positioned in respective sidewalls 111, 113 of the channel member 101. Openings 127 are provided in the channel member 101 at the respective longitudinally spaced positions to receive the connector members 103, 103a. The openings 127 allow insertion of the connector member 103, 103a into an angled receiving portion 125 of the sidewalls 111, 113.

Orientation tabs 129, 129' are provided at a front end of the channel member 101 to facilitate longitudinal insertion of a power module assembly therein as will be described further herein. As shown in the embodiments of FIG. 1, the channel member 101 is symmetrically designed with corresponding entry features 129a provided on what is shown as a back end in the view of FIG. 1.

The bottom surface 115 of the channel member 101 shown in the embodiments of FIG. 1 includes a longitudinally extending strength/alignment member 128 and a transversely (relative to the longitudinal axis $A_1$) extending mounting slot 123 on a mounting slot tab 121. A similar tab 121 and slot 123 may be provided on the back end of the channel member 101.

Also shown in the embodiments of FIG. 2 is a mounting bolt 217 that may be received through the slot 123 to couple the channel member 100 to mounting surface, such as a shelf 213 of a power cabinet or the like through a corresponding threaded hole 215 or other connection means configured to couple to the bolt 217 when the channel member 101 is mounted on the shelf 213. The coupling using the bolt 217 may allow transverse movement of the channel member 101 by an amount determined by the length of the slot 123 relative to the size of bolt 217 so as to allow longitudinal self-alignment of the channel member 101 with a cam member inserted therein.

Figure 4:
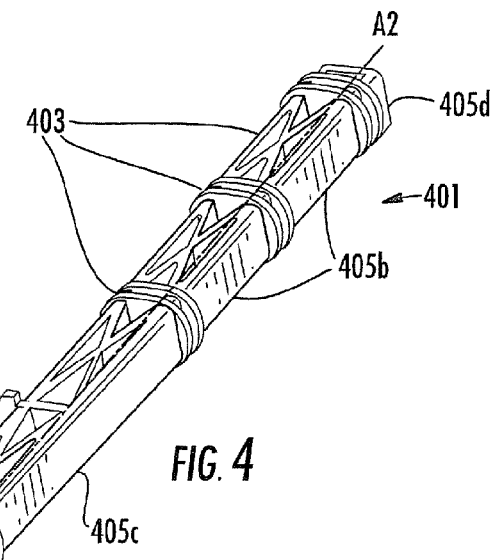
FIG. 4 is a perspective view of a cam member according to some embodiments of the present invention.

A longitudinally extending cam member 401 according to some embodiments of the present invention, suitable for use with the channel member 100 to provide a power module connection assembly, will now be described with reference to FIGS. 4 and 5. The cam member 401 is configured to be received in the channel 109 of the channel member 100 shown in FIG. 1. As seen in the embodiments of FIG. 4, the cam member 401 extends longitudinally along an axis $A_2$. The cam member 401 includes a plurality of cam segments 403, with connecting portions 405a, 405b, 405c therebetween. A back end section 405d configured for rotational mounting in a holding frame, is provided at one longitudinal end and a drive and travel limiting feature are provided at a front end. As shown in FIG. 4, segments 405b extend between the cam portions 403 with an extended length segment 405c in the central portion between two distinct sets of cam portions 403 and a front end portion 405a extends from the first of the longitudinally spaced cam portions 403.

An extension member 409 having a front face 411 extends from the front end of the cam member 401. In addition, a hexagonal drive portion 407 extends from the front end of the cam member 401, which is configured to receive a tool and transmit a torsional force from the tool to the cam member 401 to rotate the cam member 401 about the longitudinal axis $A_2$.

Figure 5:
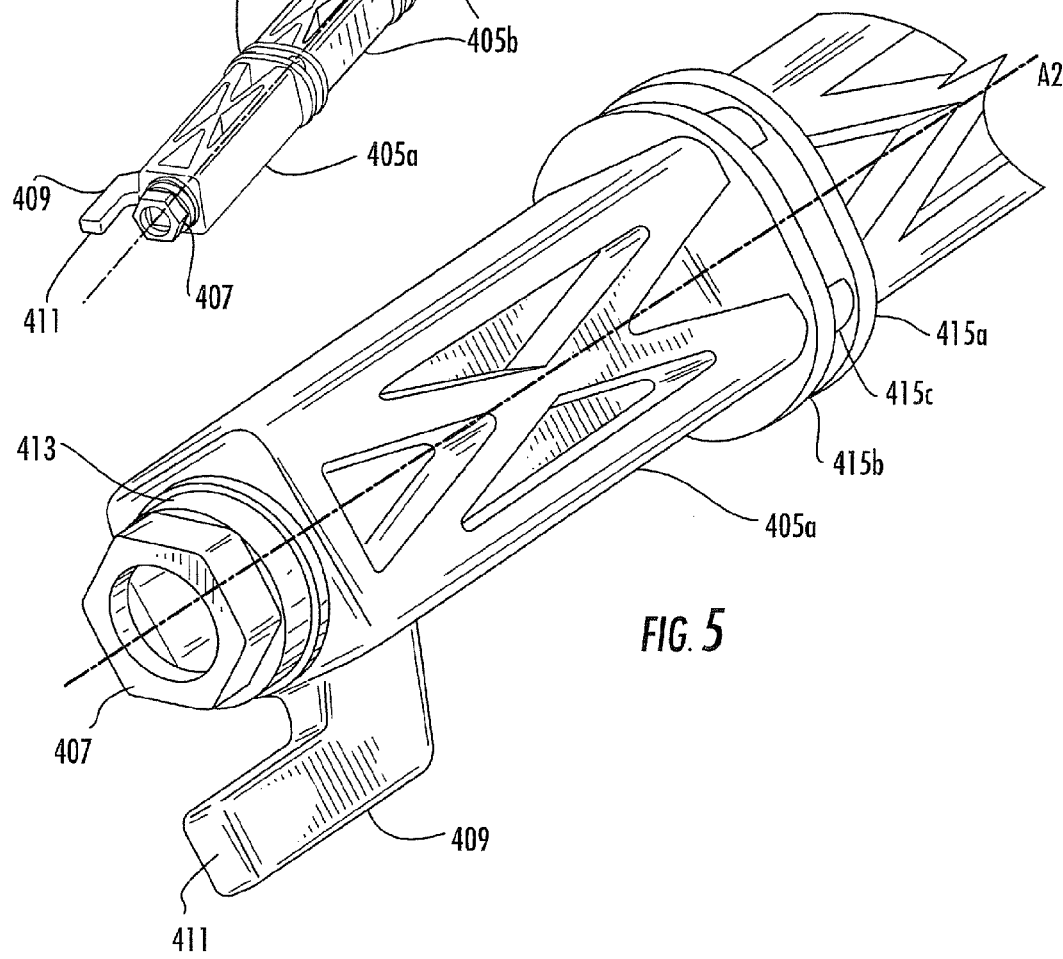
FIG. 5 is a perspective view of an end portion of the cam member of FIG. 4.

As seen in FIG. 5, the hexagonal drive portion 407 may be a separately molded or metal piece or the like that is received within a mating portion 413 of the cam member 401. As also seen in FIG. 5, each of the cam portions 403 may be a multipart structure having respective cam shaped segments 415a, 415b and connecting arms 415c therebetween. As further seen in FIG. 4, the cam member 401 may be configured with each of the segments 405a, 405b, 405c having an "X" shaped structure extending therebetween, with open segments that may provide for a reduction of weight of the cam member 401 and may further provide for improved cooling of the cam member 401 to remove heat generated by current flows and the like adjacent to the cam member 401 during use.

Figure 6:
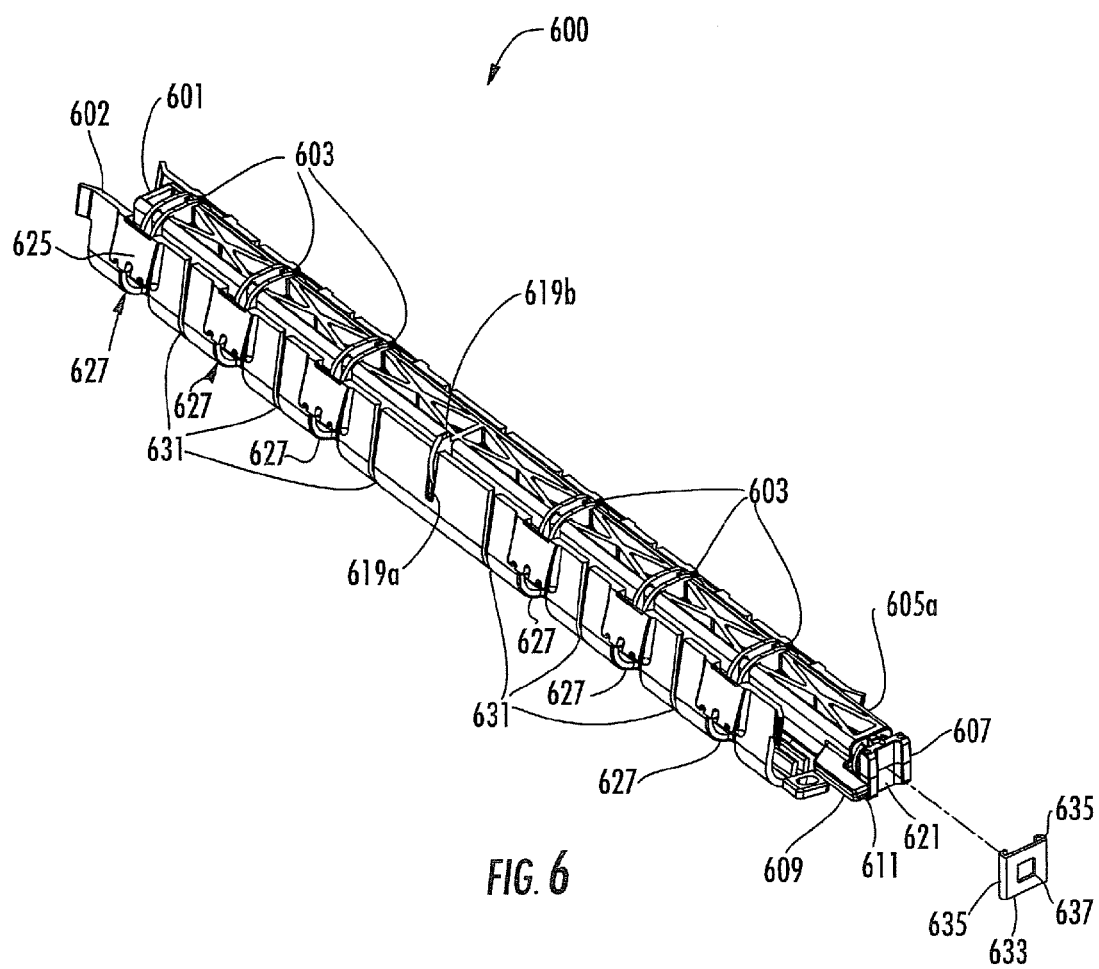
FIG. 6 is a perspective view of a power module connection assembly according to some embodiments of the present invention.

A power module connector assembly 600 according to some embodiments of the present invention will now be described with reference to FIG. 6. As seen in FIG. 6, the power module connection assembly 600 includes the longitudinally extending channel member 101 and a longitudinally extending cam member 601. The channel member 101 is shown, for purposes of illustration, without the connector members 103, 103' received therein. As seen in FIG. 6, the connector members 103, 103' would be received in the openings 627 and retained in the angled receiving portions 625 of the channel member 101. The cam portions 603 of the longitudinally extending cam member 601 are positioned to align with respective connector member receiving portions 625.

As further seen in the embodiments of FIG. 6, the channel member 602 includes a longitudinal positioned reference portion, shown as the slot 619a, and the cam member 601 includes a mating portion, shown as a tab 619b extending from the cam member 601 into the slot 619a. The tab 619b and the slot 619a cooperate so as to allow rotation of the cam member 601 about its longitudinal axis within the channel of the channel member 101 when the cam member 601 is in a longitudinal position in the channel member 602 defined by the longitudinal portion slot 619a. Furthermore, the tab 619b of the cam member 601 will come into contact with sidewalls of the channel member 101 when not aligned with the slot 619a to limit rotational movement of the cam member 601. Furthermore, once rotated into the closed or engaged position within the channel member 101 shown in FIG. 6, the positioning of the tab 619b in the slot 619a will limit further longitudinal movement of the cam member 601 in the channel member 101.

The cam member 601 shown in the embodiments of FIG. 6 includes a drive portion 607 on the front end thereof as well as a travel limiter, shown as an extension arm 609, extending forward therefrom. The extension arm 609 has a front face 611. The drive portion 607 is shown with a slot 621 extending across the forward face of the drive portion 607 that may be configured to receive a drive tool used to provide torsion for rotational movement of the cam member 601 within the channel member 101.

In some embodiments of the present invention, as shown in FIG. 6, a drive plate 633 may be coupled to the drive portion 607, for example, with side arm portion 635. The drive plate 633 may include a driver receiving opening 637, such as an opening configured to receive a half-inch drive. Thus, where the cam member 601 is a molded polymeric piece, a drive plate 633 may be provided as a metal plate configured to transmit a greater torsional force to the cam member 601 without damage to the polymer material of the cam member 601 than may result from direct driving using the channel 621. This greater drive force may be desirable as the loading required for some high current electrical connections may require a significant amount of torsional force to be applied to the cam member 601 so as to rotate the cam member to the closed position shown in FIG. 6.

Figure 7:
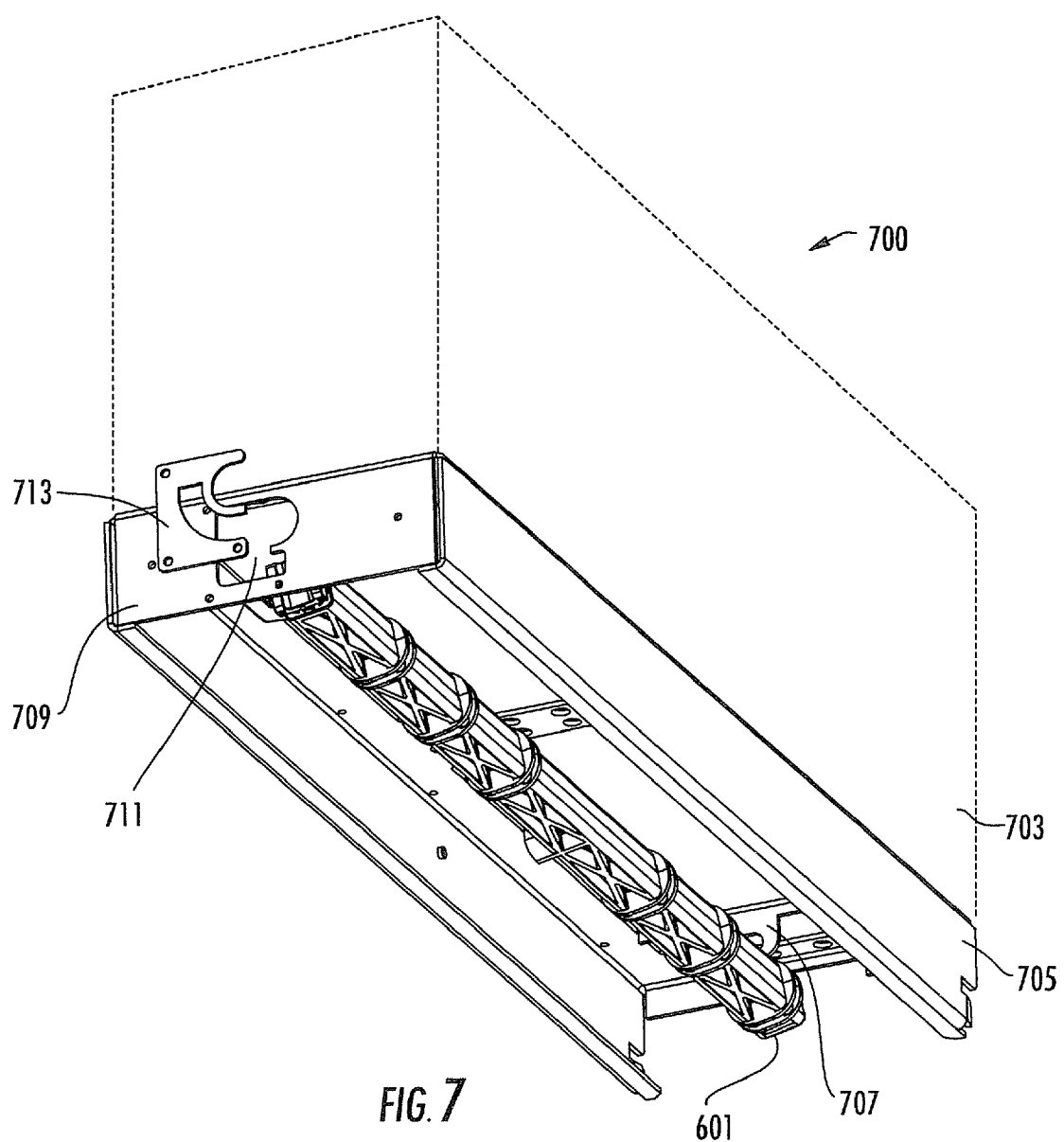
FIG. 7 is a partially exploded bottom perspective of a cam member in a frame of a power module according to some embodiments of the present invention.

A power module assembly 700 according to some embodiments of the present invention will now be described with reference to FIG. 7. As shown in the embodiments of FIG. 7, the power module assembly 700 includes a power module 703 having a frame 705 coupled thereto. The power module 703 may be a power switching module, which may include electrical components such as transistors, thyristors and the like. The components of the power module 703 may, for example, be more subject to thermal failure or the like and may be beneficially included in a removable module, while less failure prone components may be included elsewhere in the frame 705 or the like to allow for more ready repair of defective parts with limited downtime in some applications. The frame 705 rotatably couples the longitudinally extending cam member 601 to the power module 703. More particularly, the frame 705 includes a front face 709 having an opening 711 therein receiving a front end of the cam member 601. A retaining plate 713 is coupled to the front face 709 over the opening 711 to retain the cam member 601. The frame 705 also includes a bracket 707 for rotatably holding a back end of the cam member 601. While embodiments including the cam member 601 rotatably connected to the power module 703 are illustrated in FIG. 7, it will be understood that, in some embodiments of the present invention, a channel member rather than the cam member 601 is coupled to the power module.

Figure 8:
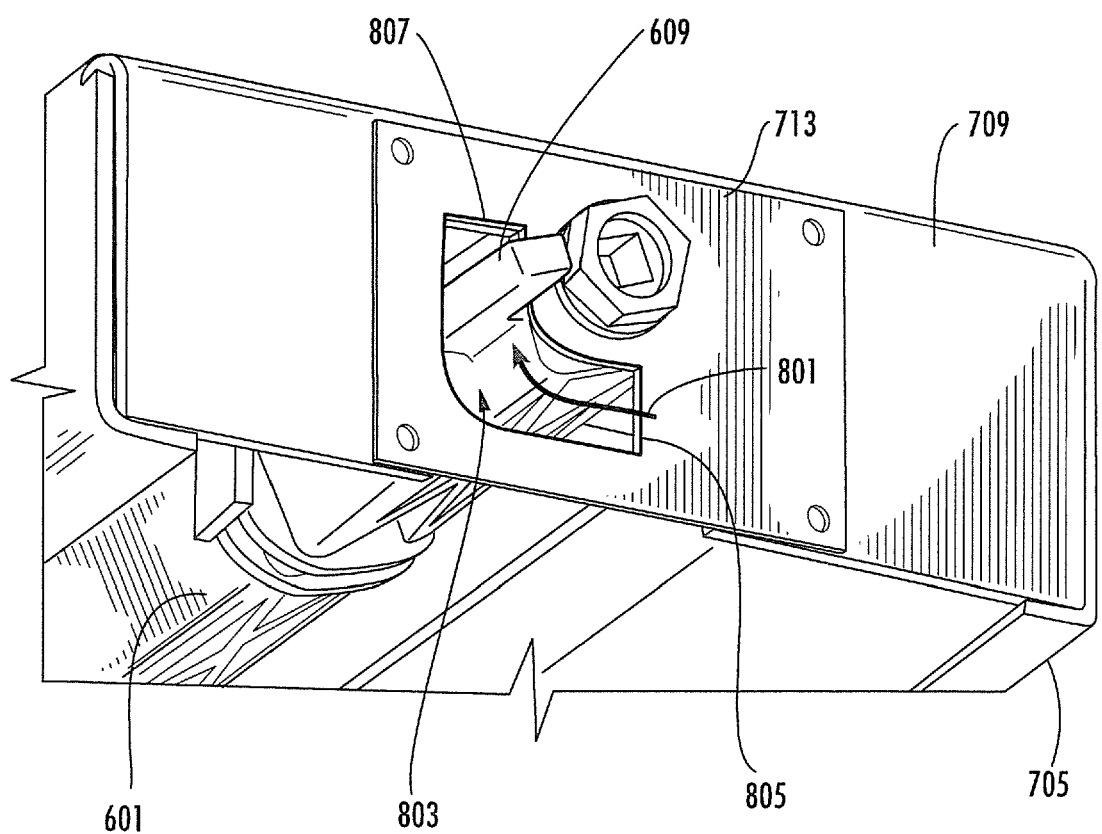
FIG. 8 is a perspective view of an end portion of a cam member mounted in a frame of a power module according to some embodiments of the present invention.

Referring now to FIG. 8, a portion of the power module 700 of FIG. 7 is shown. As seen in the embodiments of FIG. 8, the plate 713 is attached to the front face 709 with the extension member 609 extending through a slot 803 defined by the plate 713. The slot 803 is configured to allow rotational movement of the extension arm 609 in a direction indicated by the arrow 801b from the first position 805 at one of the slot 803 to a second position 807 at the second end of the slot 803 and back to the position 805. Thus, the extension arm 609 provides a travel limiter on the cam member 601 configured to limit rotational movement of the cam member 601 beyond the closed position 807 or beyond the open position 805.

Figure 9:
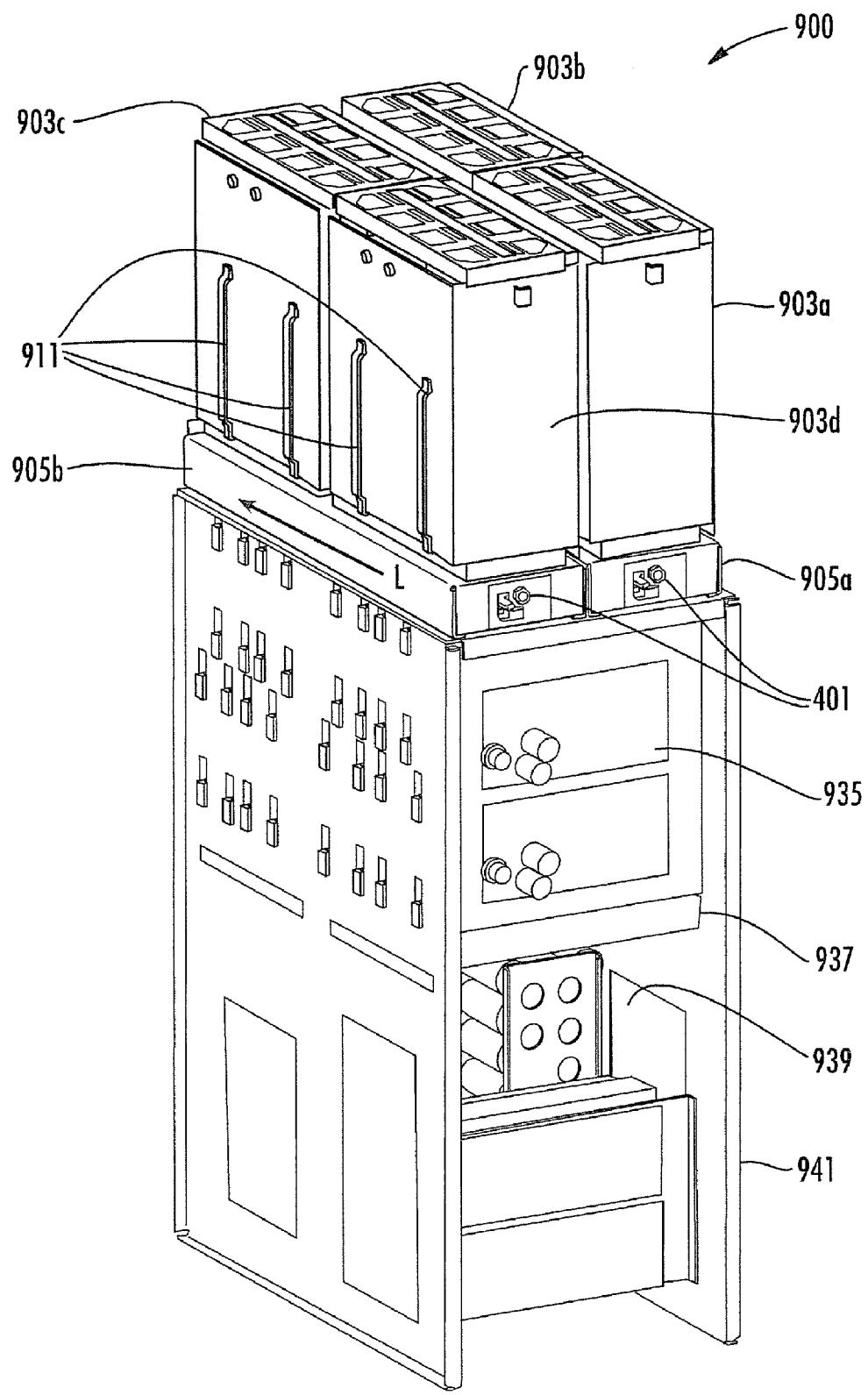
FIG. 9 is a perspective view of a uninterruptible power supply according to some embodiments of the present invention.
Figure 16A:
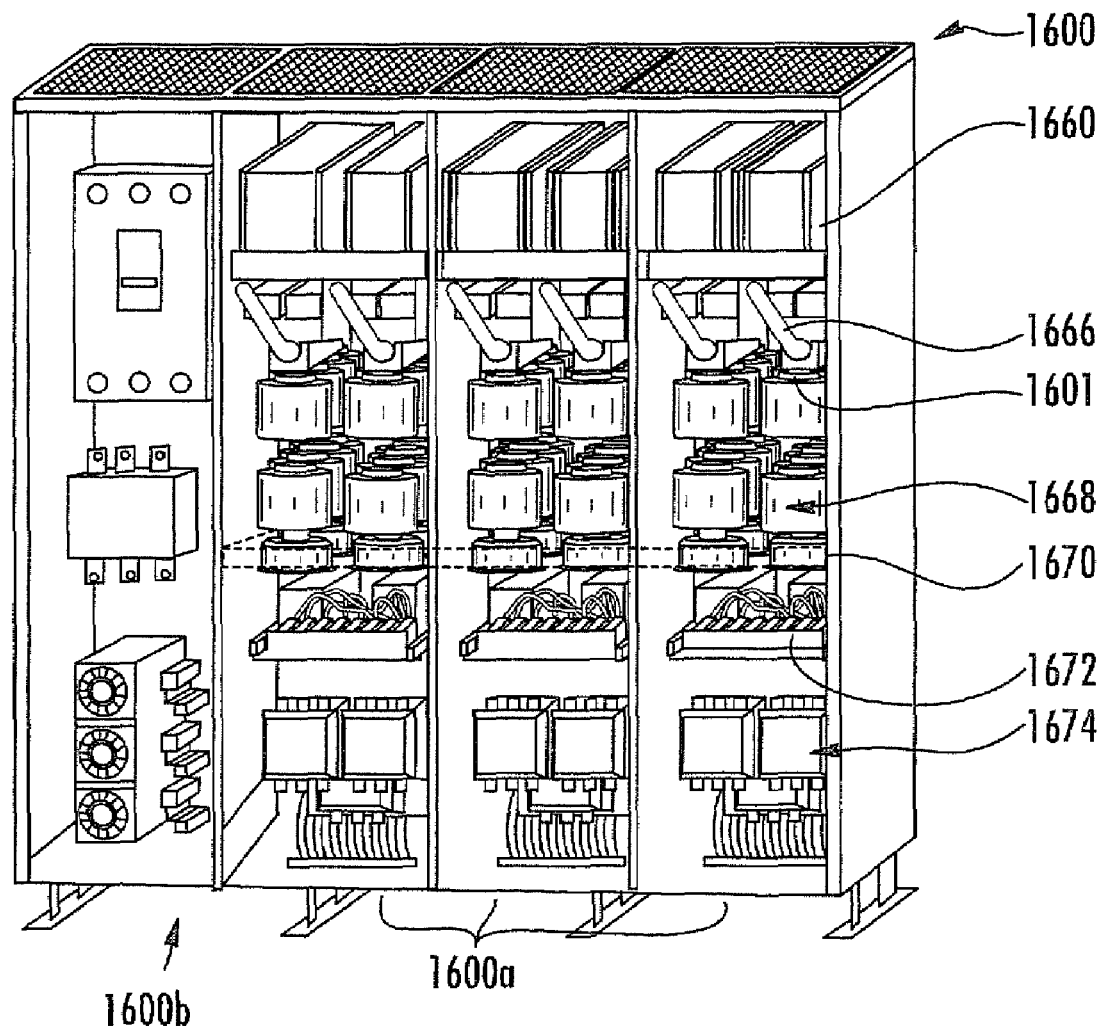
FIG. 16A is a perspective view of a uninterruptible power supply according to some embodiments of the present invention.

Referring now to FIG. 9, a uninterruptible power supply according to some embodiments of the present invention will now be described. It will be understood that, while the assembly 900 of FIG. 9 is referred to a uninterruptible power supply herein, the components illustrated in FIG. 9 may be provided as modular component parts of a high voltage uninterruptible power supply, such as illustrated in FIG. 16A. The invention is also not limited to application in uninterruptible power supplies and may be used in other power supplies, motor drives and the like. As shown in the embodiments of FIG. 9, the uninterruptible power supply 900 includes a plurality of power modules 903a, 903b, 903c, 903d including circuitry associated with operations of uninterruptible power supply 900 that are removably coupled to a power cabinet frame 941, including additional power supply circuitry sections 935, 939 as well as a cooling fan tray 937 for providing cooling to the power circuitry of the uninterruptible power supply 900. More particularly, in the embodiments of FIG. 9, the power modules 903a, 903b, 903c, 903d are longitudinally slidably received in the power cabinet frame 941 in the direction indicated by the arrow L in FIG. 9. The power modules 903a, 903b, 903c, 903d may be, for example, a plurality of leg power modules (e.g., half-leg switching circuits for rectifier and/or inverter functions) for use in the uninterruptible power supply 900. Respective power modules 903a, 903b, 903c, 903d may each include a printed circuit board carrying electronic circuits and various heat sinks and other cooling components associated therewith.

The components on the electronic circuit board may be coupled by the illustrated bus bars 911, through a power module connections assembly according to various embodiments of the present invention as described herein, to the circuitry in the sections 935 and/or 939 of the power cabinet frame 941. A reliable high current connection may be made between the circuitry in the power modules 903a, 903b, 903c, 903d and circuitry in the power cabinet frame 941 for high current operation by rotational movement of the cam members 401 shown positioned in respective frames 905a, 905b on a bottom portion of the power modules 903a, 903b, 903c, 903d where each of the respective frames 905a, 905b as shown includes two power modules coupled thereto.

Figure 10:
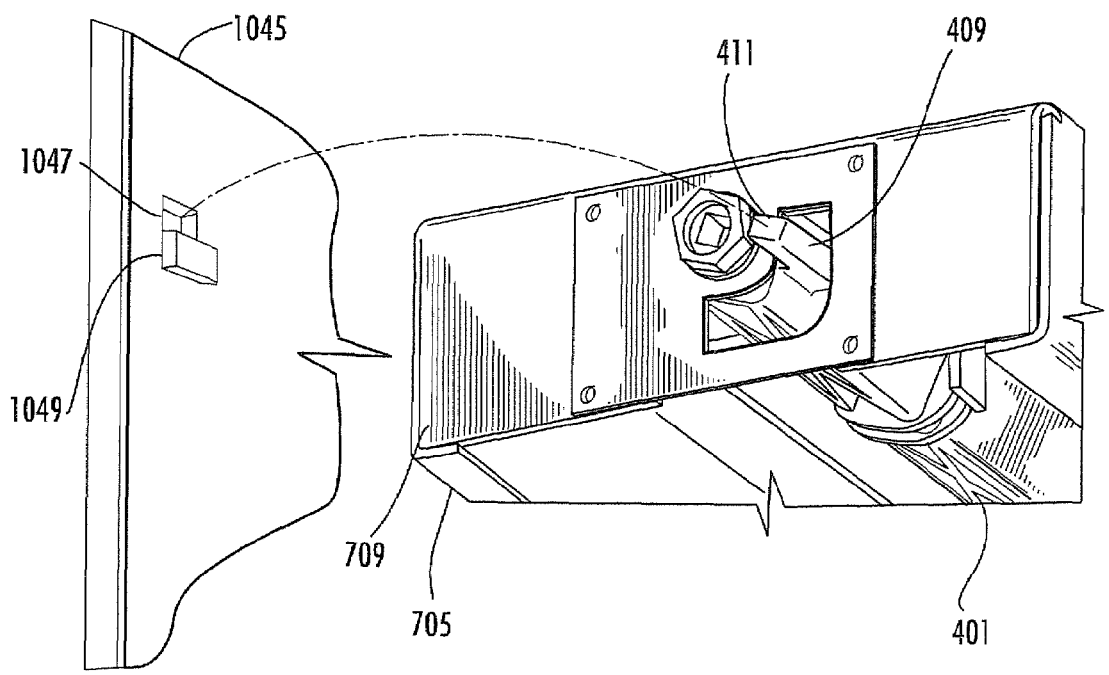
FIG. 10 is a perspective view illustrating a lock out feature according to some embodiments of the present invention.

It will also be understood that, as mentioned above, the power cabinet frame 941 may itself provide a power cabinet of a uninterruptible power supply or may be included in a larger cabinet and, in either event, may include a front door of the power cabinet configured to provide a lockout based on a rotational position of the cam members 401, 601. For example, the extension arm 409 of the cam member 401 may cooperate with a corresponding feature of a front door or the like of the power cabinet 941 to provide a lockout feature when the cabinet is not closed so as to prevent electronic operation and energizing of the circuitry when the door is open. As shown in FIG. 10, the front face 411 of the extension arm 409 may be positioned to align with and pass through an opening 1047 in a front door panel 1045 of a power cabinet only when the cam member 401, 601 is in the closed position in some embodiments. Furthermore, a switch 1049 coupled to prevent energizing of the power module when the cam member 401, 601 is not in the closed position may be positioned on the door as shown in FIG. 10, on the frame 705 or otherwise so as to detect that the cam member 401, 601 is in the closed position before allowing energizing of the uninterruptible power supply 900.

Figure 11:
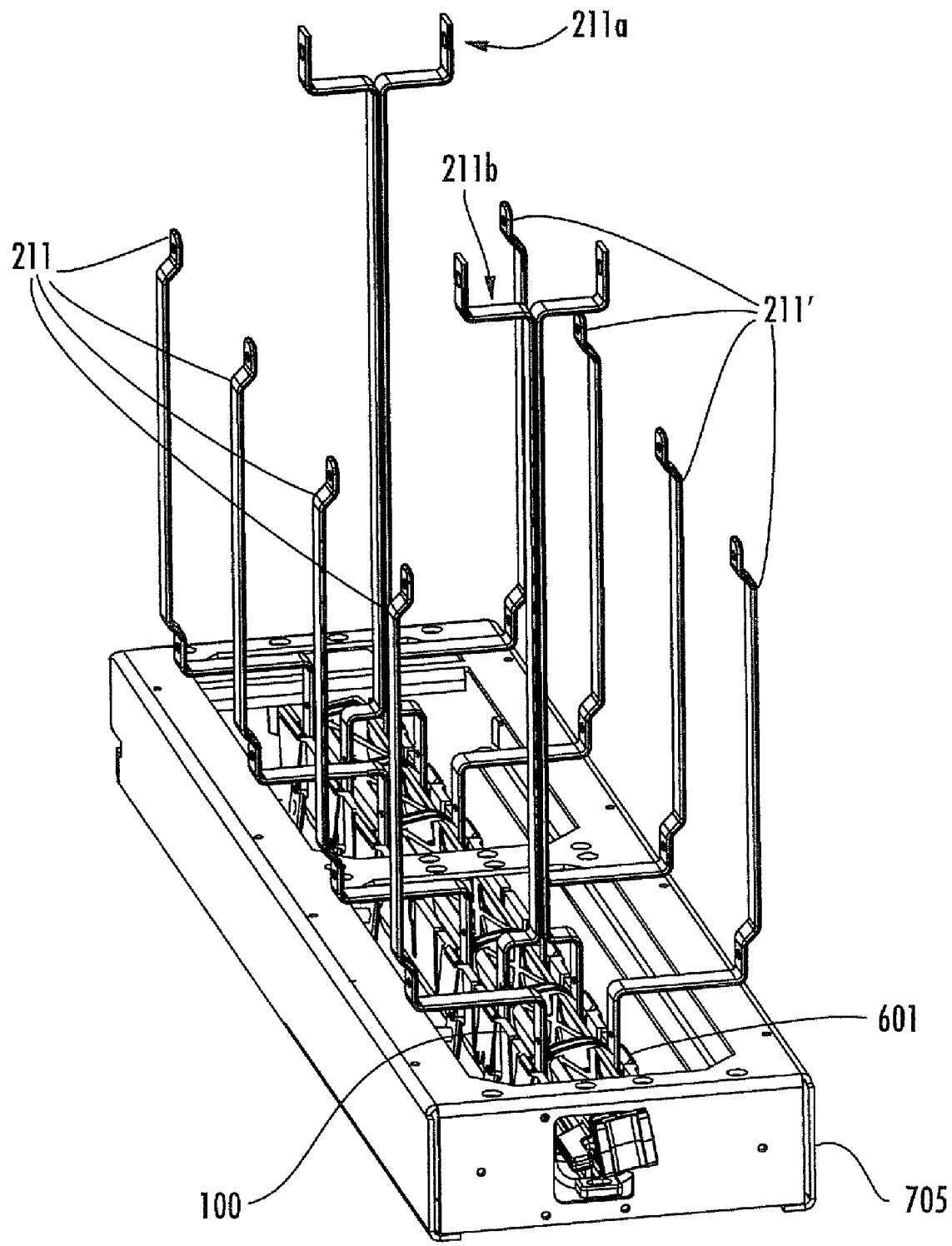
FIG. 11 is a perspective view illustrating a power module connection assembly with bus bars received therein according to some embodiments of the present invention.

Referring now to FIG. 11, a power module is illustrated with the circuitry, heat sink and the like components removed. As seen in the embodiments of FIG. 11, the mating connector bars 211, 211' are bus bars extending from connection points to the circuitry of the power module into the channel of the channel member assembly 100 adjacent the connector members 103, 103' in a position where the cam member 601 may be rotated to provide a reliable connection between the mating connector bars 211, 211' and the connection members 103, 103' in the channel member assembly 100. Two common bus bar connections 211a, 211b are also shown in FIG. 11. These common connection points may relate, for example, to electrical signals that may be common across different ones of the respective leg power modules or the like in the power modules. Note that the plate 713 is not shown mounted on the front face of the frame 705 in the illustration of FIG. 11.

Figure 12:
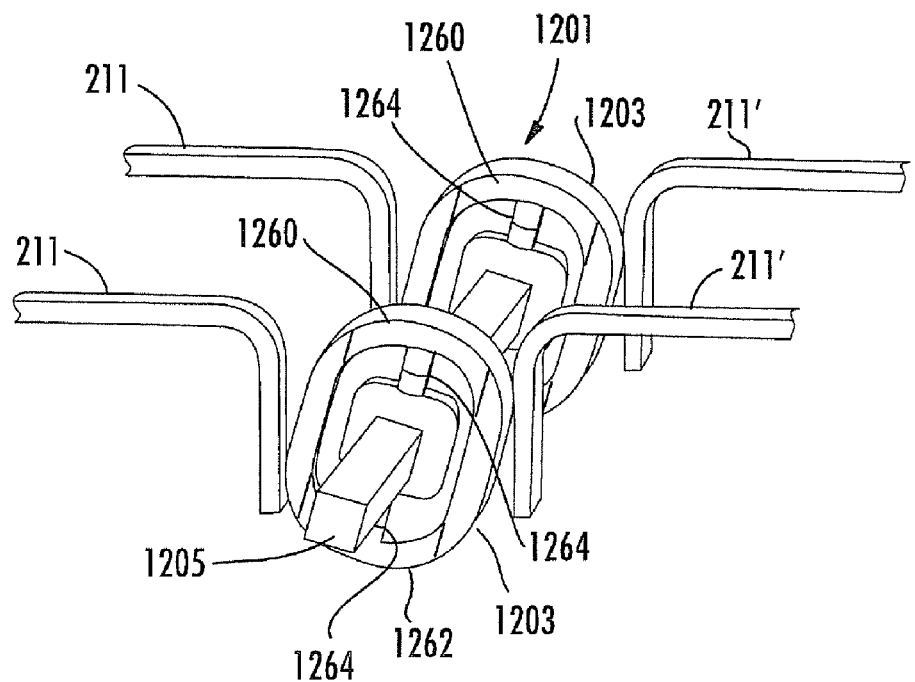
FIG. 12 is a perspective view illustrating a cam member according to other embodiments of the present invention.

Operation of a power module connection assembly according to further embodiments of the present invention will now be described with reference to FIG. 12. As seen in the embodiments of FIG. 12, a longitudinally extending cam member 1201 is shown positioned proximate a plurality of mating connector bars 211, 211'. For the cam member 1201 illustrated in the embodiments of FIG. 12, the cam pieces 1203 are shown as mounted to a rigid, longitudinally extending bar 1205, such as a metal bar, as contrasted with the previously described composite molded cam member 401, 601. Furthermore, in the illustrated embodiments of FIG. 12, the spring characteristics for providing a reliable high current electrical connection are provided by the cam pieces 1203. More particularly, the spring characteristics are provided by spring members 1264 coupled to radially movable segments 1260, 1262 of the cam member 1201. As such, the spring loading forces may be calibrated by the characteristics of the mechanical spring members 1264 and the travel stroke of the movable portions 1260, 1262 when the cam member 1201 is rotated from a first, open position to a second, closed position with the movable portions 1260, 1262 in contact with respective corresponding ones of the mating connector bars 211, 211'.

Figure 13:
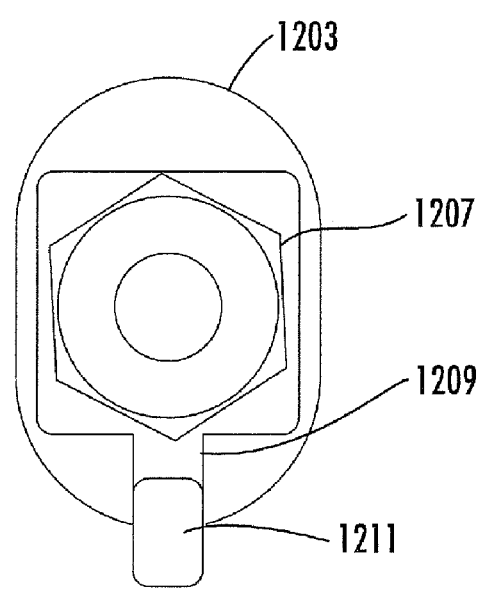
FIG. 13 is an end view of a cam member according to some embodiments of the present invention.

FIG. 13 is an end view perspective of the cam member 1201 of FIG. 12 with a drive member portion thereon. As shown in FIG. 13, the cam pieces 1203 are in an open position and a hex shaped drive member 1207 is provided on a front end portion of the rod 1207 that may be rotated by a drive member to a closed position. Also shown in FIG. 13 are an extension arm 1201 extending from a front of cam member 1201 and a front face 1211 of a leading edge of the extension arm 1209 that may mate with a door lockout feature as described previously with reference to FIG. 10 and/or provide rotational movement limit characteristics as described previously with reference to FIG. 8.

Figure 14:
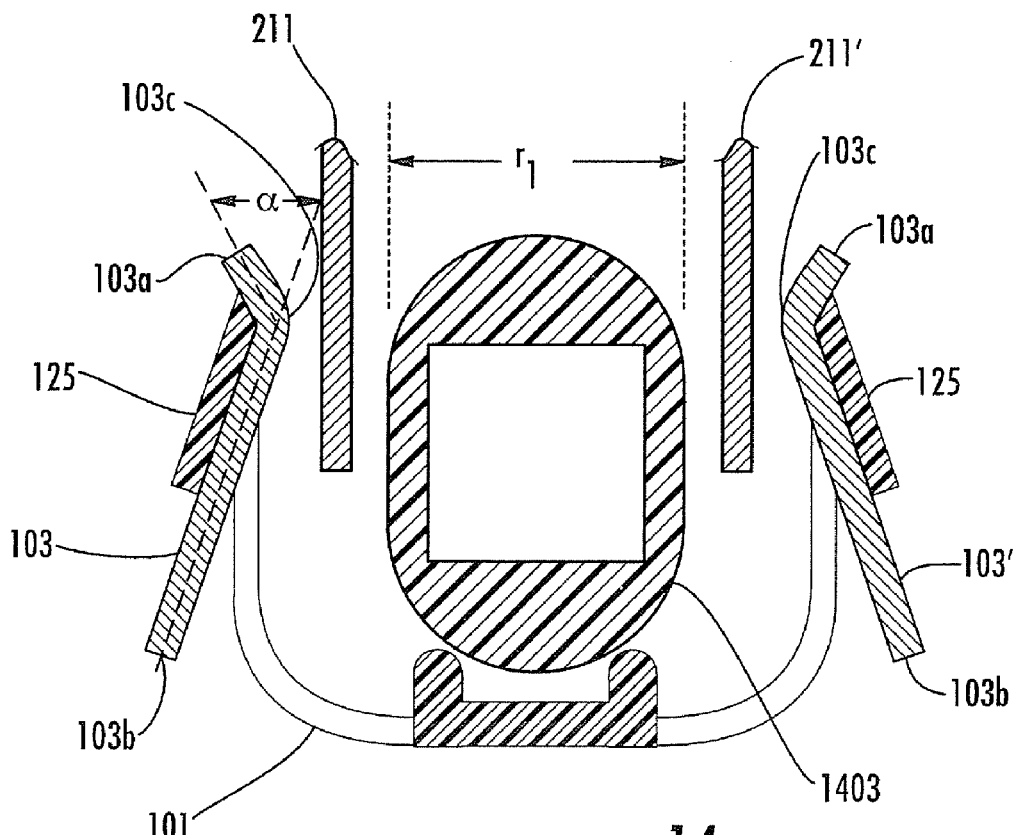
FIGS. 14 and 15 are cross-sectional views of a power module connection assembly according to some embodiments of the present invention with the cam member in a first and a second position, respectively.
Figure 15:
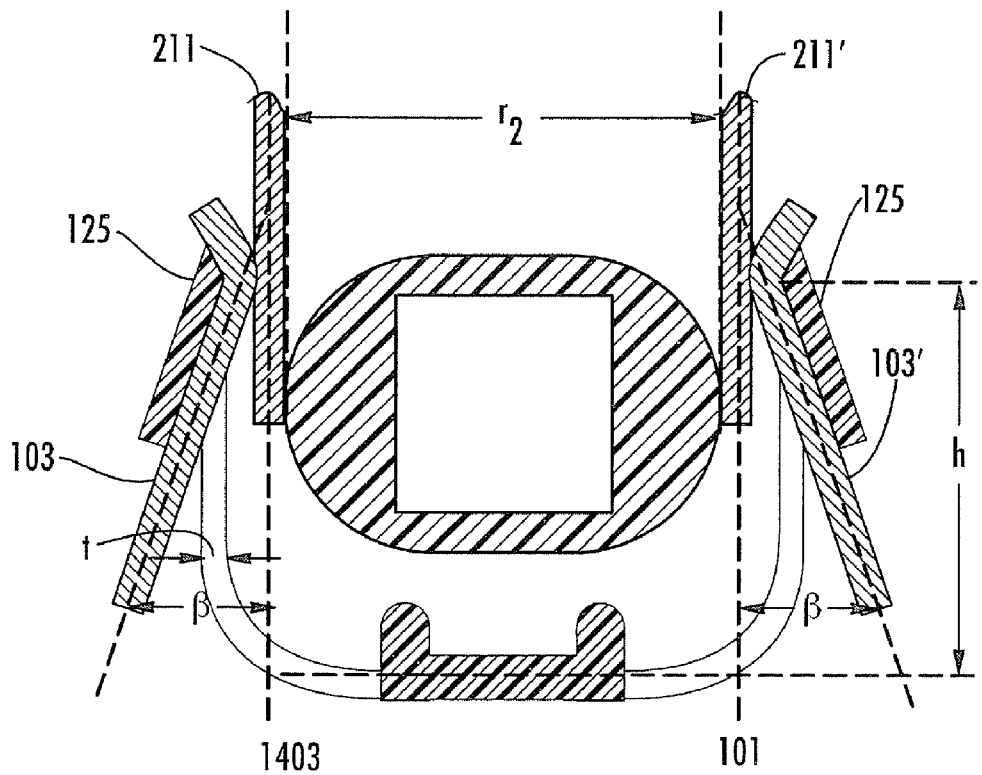

Operation of the cam member in forming an electrical connection based on rotational movement between a first and second position will now be described with reference to FIGS. 14 and 15. FIG. 14 is a cross-sectional view of a power module connection assembly with the cam member in a first or open position, while FIG. 15 is a cross-sectional view of the same arrangement with the cam member in a second or closed position where, an electrical contact is provided. It will be understood that, for embodiments including a plurality of longitudinally displaced connection members, each may operate substantially as described with reference to FIGS. 14 and 15. It will further be understood that, while the connector members 103 are shown as being provided in a paired arrangement in FIGS. 14 and 15, the present invention is not limited to such particular embodiments.

As shown in FIGS. 14 and 15, a cam piece 1403 is positioned at a longitudinal location within a channel of the channel member 101. The channel member 101 includes respective paired connector members 103, 103' positioned in angled receiving portions 125 in longitudinally aligned positions in opposite sidewalls of the channel member 101. As described previously, the connector members 103, 103' include a first end 103a in a sidewall of the channel member 101 with a face exposed to an interior channel of the channel member 101. An electrical connection section is located in the second end 103b. Furthermore, for the embodiments illustrated in FIG. 14, the first end 103a includes a first portion extending at an angle α from a second portion to define a contact region 103c therebetween. As seen in FIG. 15, the angle α and the orientation of the receiving portion 125 relative to the sidewall of the channel member 101 may be selected so that, when the cam member is in the closed position, the contact region 103c contacts its corresponding mating connector bar 211, 211' while the remainder of the first and second portion and the lower end of the connector member 103, 103' do not contact the mating connector bar 211, 211'. In other words, in the closed position shown in FIG. 15, the main axis of the connector member 103, 103' extends at an angle β relative to the main axis of the mating connector bar 211, 211'.

For the embodiments illustrated in FIGS. 14 and 15, the spring characteristics used to establish a contact force between the connector members 103, 103' and the mating connector bars 211, 211' is provided by characteristics of the channel member 101. The displacement of the mating connector bars 211, 211' towards the corresponding connector members 103, 103' is provided by the transition between the minor axis radius $r_1$ of the cam piece 1403 in the open position transitioning to the greater length of the major axis $r_2$ as shown in FIG. 15. In the open position of FIG. 14, the mating connector bars 211, 211' may be received in the channel of the channel member 101, shown as between the cam member segment 1403 and the connector members 103, 103' for the embodiments illustrated in FIGS. 14 and 15. As such, the displacement is provided by driving the mating connector bar 211, 211' towards and into engagement with the connector members 103, 103' and causing a displacement of the sidewalls of the channel member 101 that provides a spring force characteristic. A reliable engagement for conducting high electrical currents through the connection between the mating connector bar 211, 211' and connector 103, 103' may thereby be provided. In some embodiments, the engagement force may be selected for a current flow rating of up to about 350 amperes or more.

Furthermore, with the paired arrangement illustrated in FIGS. 14 and 15, transverse forces on the cam piece 1403 from pressing the connector members 103, 103' and the mating connector bars 211, 211' together are substantially offsetting. However, it will be understood that the same characteristics may be provided by providing asymmetrical sidewall features to the channel member 101. In either event, the sidewalls of the channel member 101 may have a spring characteristic selected to provide a desired force responsive to deflection of one of the mating connector bar 211, 211' and the first end 103a of the connector member 103, 103' in the second position as illustrated in FIG. 15. For example, the spring characteristic may be provided by the material selected for the channel member 101, a sidewall thickness t of the channel member 101 and a height h of a contact region 103c of the connector member 103, 103' where the connector 103, 103' contacts the mating contact bar 211, 211' relative to a bottom surface of the channel member 101. However, as described previously, in some embodiments of the present invention, the spring characteristic may be provided by the cam member and some embodiments may include a mechanical spring member or the like positioned in the cam member or the channel member.

The cam member 401, 601 in some embodiments of the present invention may be formed from an electrical grade plastic having a high torsional strength. In some embodiments, the cam member 401, 601 is polybutylene terephthalate (PBT). In some embodiments, the minor axis radius $r_1$ of the cam piece 1403 is about 38 mm and the major axis $r_2$ is about 45 mm and the relative displacement of the connector members 103, 103' relative to the mating connector bars 211, 211' when the cam member 401, 601 is moved from the opened to the closed position is about 2.5 mm/side or about 5 mm total. A limited deflection may reduce the risk of creep of the materials of the channel and or cam members.

The channel member 101 in some embodiments is formed from a material having a high dimensional stability (low creep) with age and/or temperature. In some embodiments, the channel member 101 is an electrical grade plastic, such as polyphenylene sulfide. In some embodiments, the sidewall thickness t of the channel member 101 is about 5 mm and the height h of the contact region 103c of the connector member 103, 103' where the connector 103, 103' contacts the mating contact bar 211, 211' relative to a bottom surface of the channel member 101 is about 55 mm.

Figure 19:
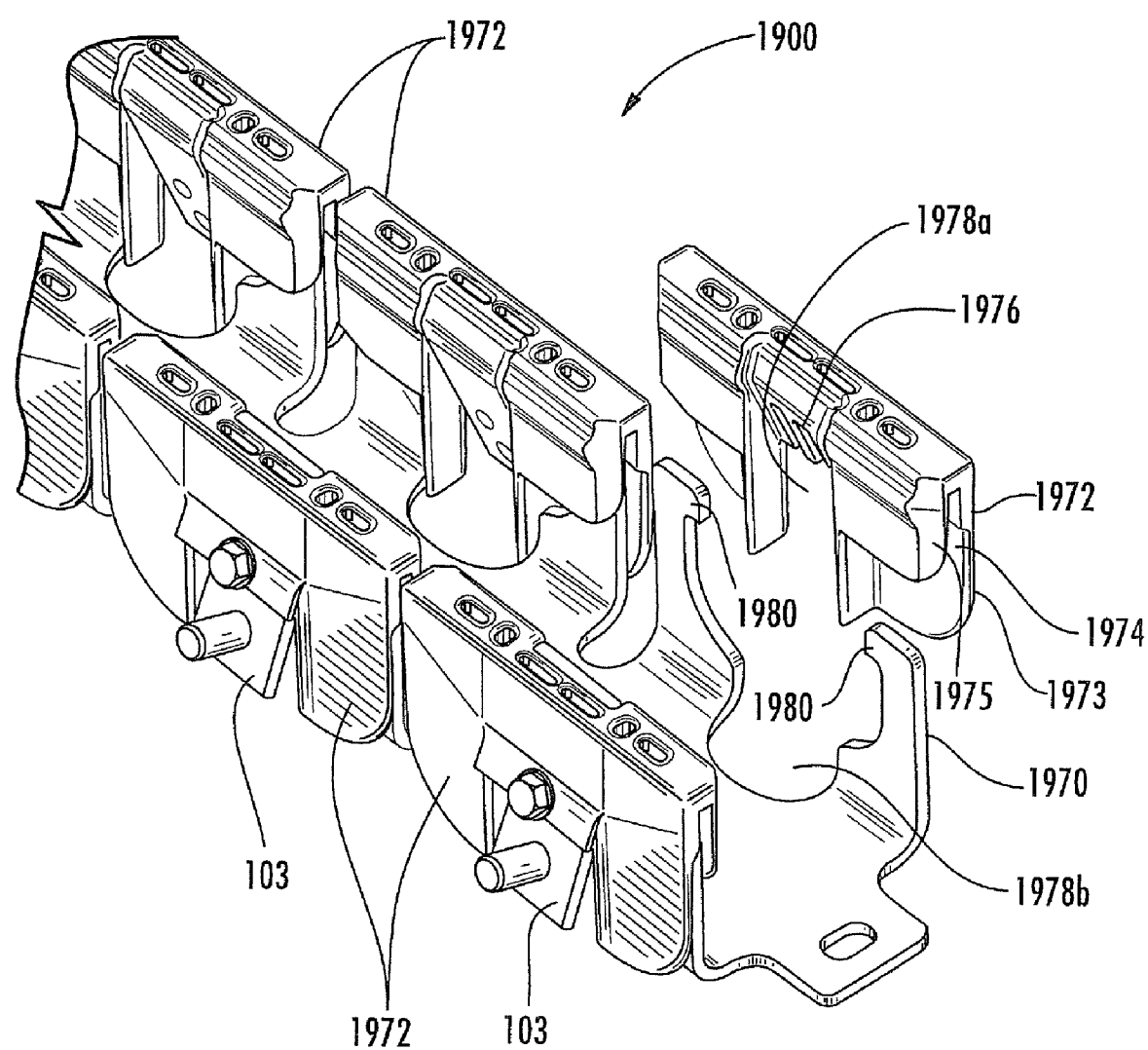
FIG. 19 is a perspective view of a channel member according to other embodiments of the present invention.

A channel member assembly 1900 according to some other embodiments of the present invention is shown in FIG. 19. As seen in FIG. 19, the channel member assembly 1900 includes a channel member having a plurality of electrical grade plastic inserts 1972 positioned in contact regions on a metal channel portion 1970. The inserts 1972 include a longer outer wall 1973 positioned displaced from a shorter inner wall 1975 to define a slot 1974 therebetween that is configured to receive mating portions 1980 of the metal channel portion 1970 to mount the inserts 1972 in position on the metal channel portion 1970. An opening 1978a of the insert 1972 is positioned aligned with an opening 1978b of the metal channel portion 1970 to define an opening receiving a connector member 103. The insert 1972 further includes a sloped portion 1976 to which the connector member 103 may be affixed in a desired position and at a desired angle within the channel member assembly 1900. The insert 1972 may be a polymeric material with a high dimensional stability (low creep) with age and/or temperature. For example, the insert 1972 may be an electrical grade plastic, such as polyphenylene sulfide.

The first portion of the first end 103a of the connector member 103, 103' in some embodiments extends at an angle of about 22 degrees from the second portion and the receiving portion 125 of the channel member 101 extends at an angle of about 22 degrees relative to the sidewall 111, 113 of the channel member. The main axis of the connector member 103, 103' in some embodiments extends at an angle of about 3 degrees or less relative to the main axis of the mating connector bar 211, 211'.

A uninterruptible power supply 1600 according to some embodiments of the present invention will now be described with reference to FIGS. 16A and 16B. As shown in the embodiments of FIG. 16A, the uninterruptible power supply 1600 may include a selectable number of power sections 1600a, where three section 1600a are shown in FIG. 16A. However, a flexible configuration may be provided, for example, wherein each of the sections 1600a may provide a 275 kVA capacity and the additional units may provide increased capacity ratings in 275 kVA increments, redundancy or the like. For the embodiments illustrated in FIG. 16A, the sections 1600a are paired with a breaker section 1600b including various circuitry shared across each of the respective sections 1600a, such as input breakers, backfeed contactors, bypass static switches and the like. Each of the sections 1600a as shown in the embodiments of FIG. 16A, includes leg power modules 1660, power module connection assemblies 1601, leg inductors in an inductor array 1668, cooling fans 1670, a filter pan 1672 and input/output circuitry 1674. The leg power modules 1660 are removable using a rotationally activated power module connection assembly 1601, which provides for making and breaking of electrical connections using a molded handle 1666 to allow insertion of the leg power modules 1660.

Figure 16B:
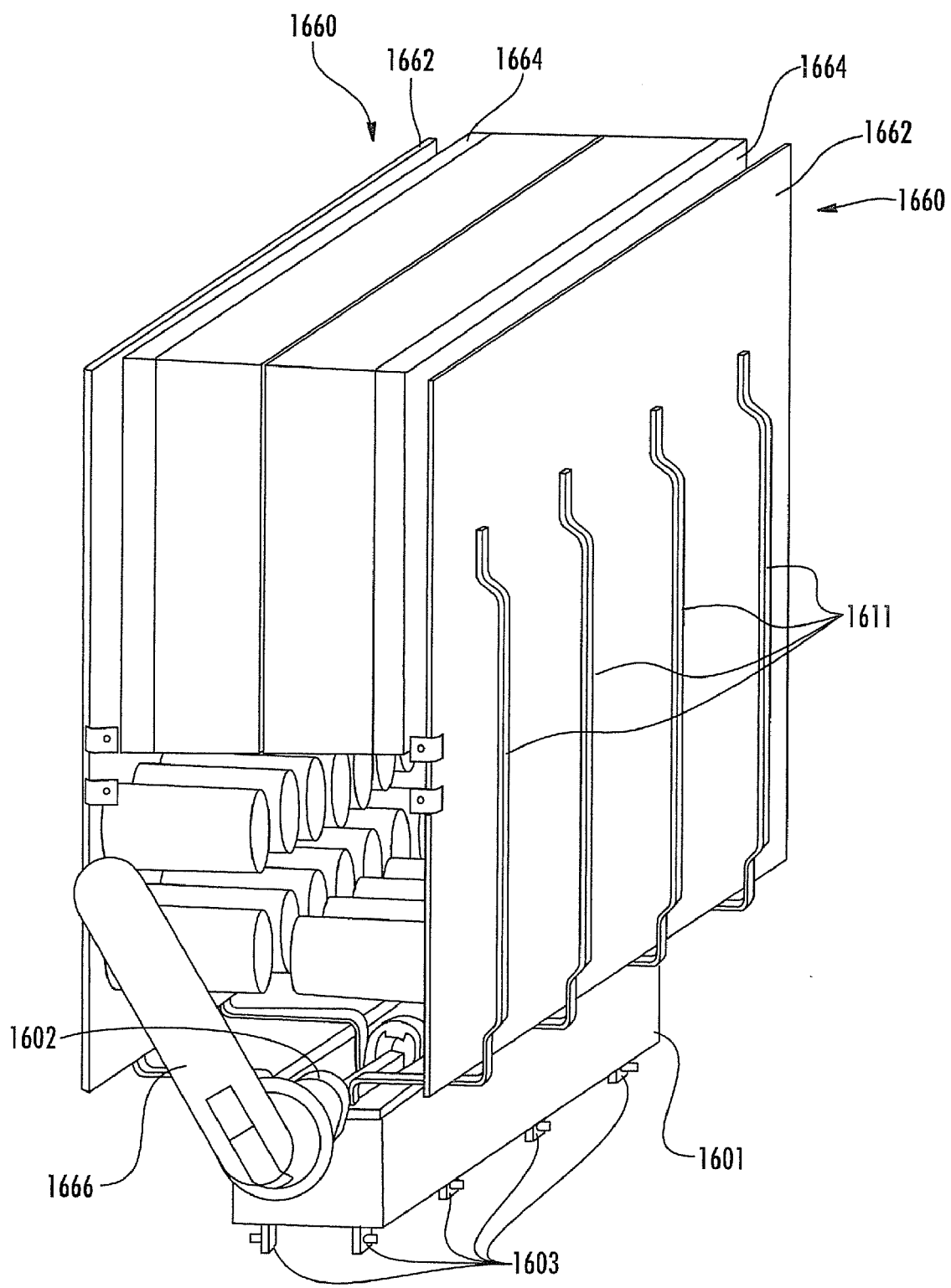
FIG. 16B is a perspective view illustrating a power module and power module connection assembly of the uninterruptible power supply of FIG. 16A according to some embodiments of the present invention.

Referring now to FIG. 16B, further details of two leg power modules 1660 and power module connection assembly 1601 will now be described. As illustrated in FIG. 16B, a longitudinally extending, box-type channel member 1601 is illustrated with connector members 1603 extending therefrom in a direction towards the inductor array 1668. The handle 1666 is molded or otherwise connected to a longitudinally extending cam member 1602 that is rotationally movably mounted in the box type channel member 1601 or rotationally movably mounted to the power modules 1660. Thus, as contrasted with the previously described embodiments, neither the channel member 1601 nor the cam member 1602 in the embodiments of FIG. 16B need be coupled to an removed with the removable power modules 1660.

The illustrated power modules 1660 include printed circuit board(s) 1662 having power circuitry mounted thereon and heat sink(s) 1664, shown positioned between the printed circuit boards 1662, to help conduct heat from components mounted thereon. Bus bars 1611 are shown extending from a back connection point on the printed circuit boards 1662 to a receiving position adjacent respective cam pieces of the cam member 1602 within a channel defined by the box-type channel member 1601.

As shown for the embodiments of FIG. 16B, the power modules 1660 are inserted from above into the channel member 1601 rather than being longitudinally slidably received therein. In addition, while only a single pair of power modules 1660 is shown as received in the channel member 1601, a plurality of aligned power modules 1660 may be received in a single channel member 1601 having a longitudinal length selected for receiving respective ones of the power modules along the rotational axis of the cam member 1602.

Figure 17:
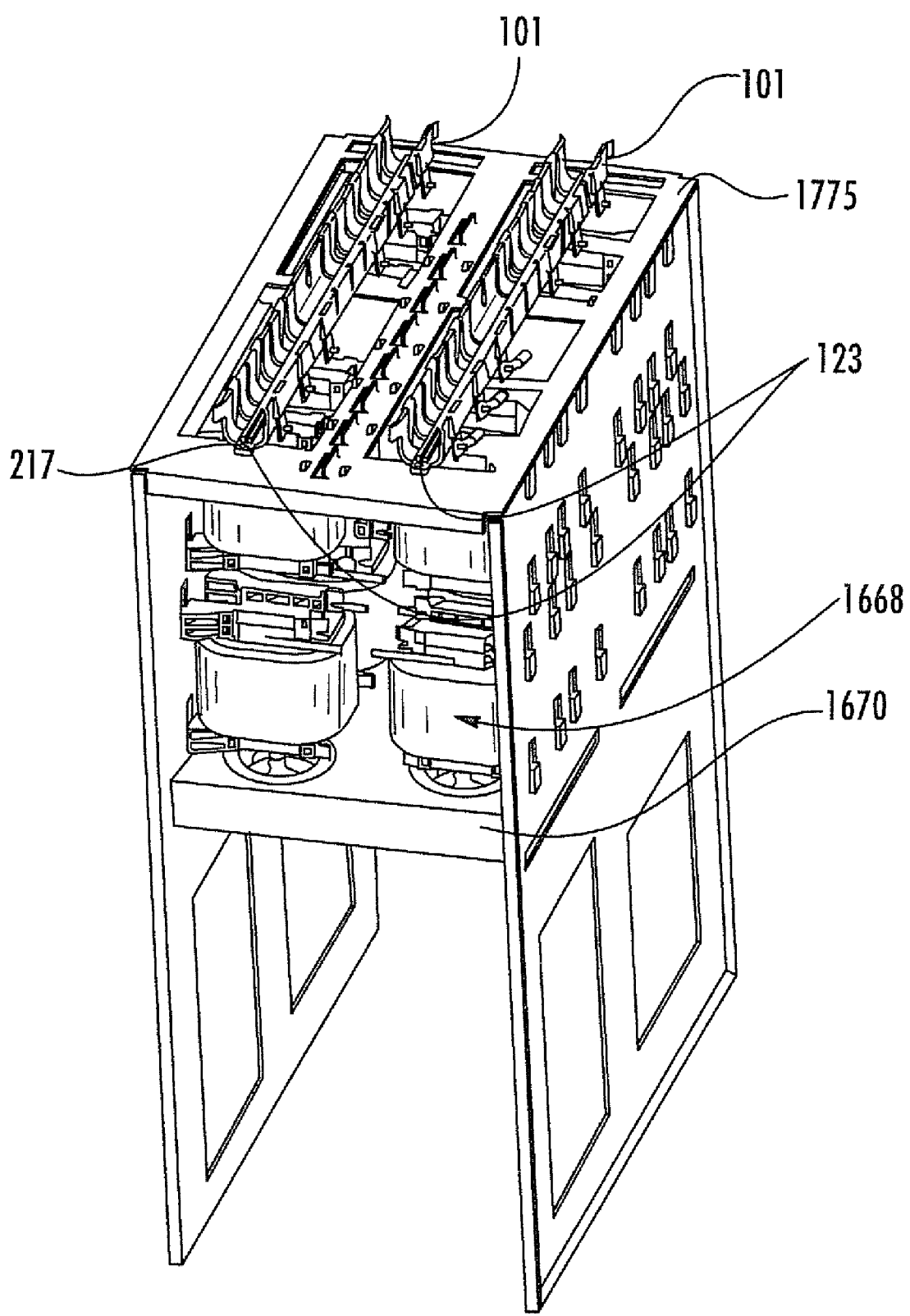
FIG. 17 is a perspective view of a power cabinet frame and inductor array according to some embodiments of the present invention.

Further embodiments of the present invention will now be described with reference to FIG. 17. As shown in the embodiments of FIG. 17, two longitudinally extending channel members 101 are shown mounted on a shelf 1775 positioned in a power cabinet above an inductor array 1668 with a fan tray 1670 positioned below the inductor array 1668. As described with reference to FIG. 1, the longitudinally extending channel member 101 may include a mounting slot 123 on both a front and a back end thereof. The connection of the channel members 101 to the shelf 1775 may be provided so as to allow some transverse movement of the channel member 101 on the shelf 1775 when a power module and cam member are slidably and longitudinally received therein. Accordingly, the cam member and the channel member 101 may be longitudinally self-aligning when the cam member is inserted in the channel member 101. However, in some embodiments of the present invention, the transverse movement for longitudinal self-alignment may be provided by the mounting of the cam member and/or the mounting of both the cam member and the channel member 101.

The fan tray 1670 illustrated in FIG. 17 may include a plurality of cooling fans positioned in a slidable tray that may be opened to allow, for example, access to the fans for repair thereof. The cooling fans may be configured to drive air through vertically extending cooling passageways in the cabinet of the uninterruptible power supply 1600 to facilitate cooling of components of the power supply, such as capacitors, heat sinks and/or inductors. The cooling fans may be configured to blow air up from the bottom of the uninterruptible power supply 1600 past the capacitors, the heat sinks and the inductors in the inductor array 1668.

Figure 18:
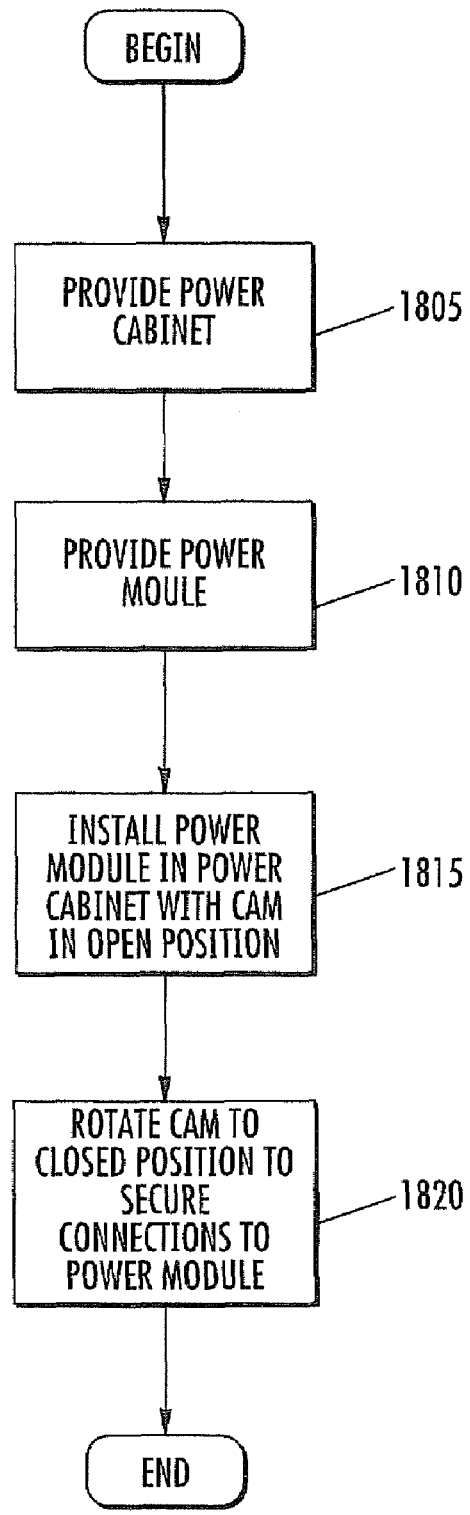
FIG. 18 is a flow chart illustrating a method configuring a uninterruptible power supply according to some embodiments of the present invention.

Methods of configuring a uninterruptible power supply according to some embodiments of the present invention will now be described with reference to the flow chart illustration of FIG. 18. Operations begin with providing a power cabinet, such as described above for various embodiments of the apparatus of the present invention (Block 1805). The power cabinet may include components of the uninterruptible power supply and include either a longitudinally extending channel member or a longitudinally extending cam member therein. The longitudinally extending channel member includes a first end of each of a plurality of connector members at longitudinally spaced positions in a sidewall thereof. Each of the first ends has a face exposed to an interior channel of the channel member and an electrical connection section on a second end of the connector members. The second end is displaced from the first end. The longitudinally extending cam member is configured to be positioned in the channel of the channel member and is rotatably movable within the channel. A power module is provided including the other of the longitudinally extending channel member or longitudinally extending cam member (Block 1810).

The power module is installed in the power cabinet with the cam member in the channel in a first rotational position with a plurality of mating connector bars extending from the one of the power module and the power cabinet having the cam member coupled thereto received in the channel of the channel member proximate the first ends of the connector members (Block 1815). The cam member is rotated to a second rotational position to press the mating connector bars and the first ends of the connector members together (Block 1820).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A power module connection assembly, comprising:
a longitudinally extending channel member including a connector member, a sidewall and an interior channel, wherein the connector member has a first end positioned in the sidewall with a face exposed to the interior channel and an electrical connection section on a second end, the second end being displaced from the first end;
a longitudinally extending cam member configured to be removably positioned in the interior channel of the channel member, the cam member being rotatably movable within the channel from a first position wherein the interior channel of the channel member is configured to receive a mating connector bar proximate the first end of the connector member to a second position to press the mating connector bar and the first end of the connector member together; and
wherein the cam member is configured to be coupled to a first component and the channel member is configured to be coupled to a second component and the power module connection assembly provides an electrical connection between the respective components when the cam is positioned in the channel in the second position.

2. The assembly of claim 1, wherein, in the second position, the cam member deflects one of the mating connector bar and the first end of the connector member towards the other of the first end of the connector member and the mating connector bar.

3. The assembly of claim 1, further comprising
a power module and wherein the cam member is rotatably connected to the power module or the channel member is coupled to the power module and wherein the power module is configured to be received in a power cabinet including the other of the cam member or the channel member with the cam member in the channel when the cam member is in the first position.

4. The assembly of claim 3, wherein the power module is configured to be longitudinally slidably receivable in the power cabinet.

5. The assembly of claim 3, wherein the first end of the connector member has first portion extending at an angle from the second portion to define a contact region therebetween and wherein the first end of connector member is positioned in the channel member so that the contact region contacts the mating connector bar and the first and second portion do not contact the mating connector bar in the second position.

6. The assembly of claim 3. wherein the channel member further comprises a longitudinal position reference portion and the cam member includes a mating portion and wherein the longitudinal position reference portion and the mating portion limit rotation of the cam member from the first position to the second position when the cam member is not in a longitudinal position in the channel member defined by the longitudinal reference portion.

7. The assembly of claim 6, wherein the longitudinal reference portion and the mating portion are further configured to limit longitudinal movement of the cam member in the channel when the cam member is not in the first position.

8. The assembly of claim 3, further comprising a travel limiter on the cam member configured to limit rotational movement of the cam member beyond the second position.

9. The assembly of claim 3, further comprising a drive member on an end of the cam member configured to receive a tool and transmit a torsional force from the tool to the cam member to rotate the cam member between the first position and the second position.

10. The assembly of claim 9 wherein the cam member is a molded member and wherein the tool is integrally molded with the cam member.

11. The assembly of claim 3, further comprising a switch coupled to prevent energizing of the power module when the cam member is not in the second position.

12. The assembly of claim 3 wherein the cam member and the channel member are longitudinally self-aligning when the cam member is inserted in the channel member.

13. The assembly of claim 12 wherein the cam member or the channel member are connected to the power module or power cabinet, respectively, so as to allow angular movement about a longitudinal axis of the cam member or channel member to longitudinally self-align the cam member and the channel member when the cam member is inserted in the channel member.

14. The assembly of claim 3, wherein the channel member includes a plurality of longitudinally spaced connector members in respective sidewalls thereof and wherein the channel of the channel member is configured to receive a plurality of mating connector bars proximate corresponding ones of the plurality of connector members and pressed together therewith responsive to rotation of the cam member from the first position to the second position.

15. The assembly of claim 14 wherein ones of the connector members are arranged in a paired arrangement on opposite sidewalls of the channel member at respective longitudinal positions so that transverse forces on the cam member pressing the connector members and mating connector bars together are substantially offsetting.

16. The assembly of claim 3, wherein, in the second position, the cam member deflects one of the mating connector bar and the first end of the connector member towards the other of the first end of the connector member and the mating connector bar and wherein sidewalls of the channel have a spring characteristic selected to provide a desired force responsive to deflection of the one of the mating connector bar and the first end of the connector member in the second position.

17. The assembly of claim 16, wherein the spring characteristic is provided by a material and a sidewall thickness of the channel member and a height of a contact region of the connector member where the connector member contacts the mating connector bar relative to a bottom surface of the channel member.

18. The assembly of claim 3, wherein, in the second position, the cam member deflects one of the mating connector bar and the first end of the connector member towards the other of the first end of the connector member and the mating connector bar and wherein the cam member has a spring characteristic selected to provide a desired force responsive to deflection of the one of the mating connector bar and the first end of the connector member in the second position.

19. The assembly of claim 18, wherein the spring characteristic is provided by a spring member mounted in the cam member.

20. The A power module connection assembly of claim 1, further comprising
a power module and a power cabinet and wherein the cam member is rotatably connected to the power module and the channel member is configured to be coupled to the power cabinet and wherein the power module is configured to be received in the power cabinet with the cam member in the channel when the cam member is in the first position.

21. The assembly of claim 1, wherein the channel member comprises a metal channel portion having a plastic insert in a sidewall thereof and wherein the first end of the connector member is received in the plastic insert without contacting the metal channel portion.

22. The assembly of claim 1, wherein the first component comprises a power module and the second component comprises a power cabinet.

23. An uninterruptible power supply including the power module connection assembly of claim 22 and further comprising the power module and the power cabinet.

24. The assembly of claim 1, wherein the channel is configured to receive the mating connector bar between the cam member and the connector member.

25. A power module connection assembly, comprising:
a longitudinally extending channel member including a connector member, a sidewall and an interior channel, wherein the connector member has a first end positioned in the sidewall with a face exposed to the interior channel and an electrical connection section on a second end, the second end being displaced from the first end;
a longitudinally extending cam member configured to be removably positioned in the channel of the channel member, the cam member being rotatably movable within the channel from a first position wherein the channel of the channel member is configured to receive a mating connector bar proximate the first end of the connector member to a second position to press the mating connector bar and the first end of the connector member together; and
a power module,
wherein the cam member is rotatably connected to the power module or the channel member is coupled to the power module and wherein the power module is configured to be received in a power cabinet including the other of the cam member or the channel member with the cam member in the channel when the cam member is in the first position;
wherein the channel member further comprises a longitudinal position reference portion and the cam member includes a mating portion and wherein the longitudinal position reference portion and the mating portion limit rotation of the cam member from the first position to the second position when the cam member is not in a longitudinal position in the channel member defined by the longitudinal reference portion; and
wherein the longitudinal reference portion comprises a slot in the channel member and wherein the mating portion comprises a tab extending from the cam member into the slot when the cam member is in the longitudinal position in the channel member defined by the longitudinal reference portion.

26. A power module connection assembly, comprising:
a longitudinally extending channel member including a connector member, a sidewall and an interior channel, wherein the connector member has a first end positioned in the sidewall with a face exposed to the interior channel and an electrical connection section on a second end, the second end being displaced from the first end;
a longitudinally extending cam member configured to be removably positioned in the interior channel of the channel member, the cam member being rotatably movable within the interior channel from a first position wherein the channel of the channel member is configured to receive a mating connector bar proximate the first end of the connector member to a second position to press the mating connector bar and the first end of the connector member together;
a power module, wherein the cam member is rotatably connected to the power module or the channel member is coupled to the power module and wherein the power module is configured to be received in a power cabinet including the other of the cam member or the channel member with the cam member in the channel when the cam member is in the first position; and
a travel limiter on the cam member configured to limit rotational movement of the cam member beyond the second position, wherein the cam member is rotationally mounted in a frame and wherein the travel limiter comprises an extension member extending from an end of the cam member that is received in a corresponding opening in the frame, the opening having a first end corresponding to the first position and a second end corresponding to the second position.

27. An uninterruptible power supply, comprising:
a power cabinet;
a power module removably coupled to the power cabinet; and
a power module connection assembly that couples the power module to the power cabinet, the power module connection assembly, comprising:
a longitudinally extending channel member coupled to one of the power cabinet or the power module, the channel member including a first end of each of a plurality of connector members at longitudinally spaced positions in a sidewall thereof, each of the first ends having a face exposed to an interior channel of the channel member, the connector members having an electrical connection section on a second end of the connector members, the second end being displaced from the first end;
a longitudinally extending cam member coupled to the other of the power cabinet or the power module, the cam member being configured to be removably positioned in the channel of the channel member, the cam member being rotatably movable within the channel from a first position wherein a plurality of mating connector bars may be received in the channel of the channel member proximate the first ends of the connector members to a second position to press the mating connector bars and the first ends of the connector members together and wherein the power module connection assembly provides an electrical connection between the power cabinet and the power module when the cam is positioned in the channel in the second position.

28. The uninterruptible power supply of claim 27, wherein the channel member is coupled to the power cabinet and wherein the power cabinet includes a plurality of inductors electrically coupled to the electrical connection sections on the second ends of ones of the connector members and wherein the power module includes a printed circuit board and the mating connector bars comprise bus bars extending from the printed circuit board or crimped lugs on ends of wires extending from the printed circuit board.

29. The uninterruptible power supply of claim 27, wherein the channel member extends from a front face to a rear face of the power cabinet and wherein the cam member is longitudinally slidably receivable in the channel member to receive the power module in the power cabinet.

30. The uninterruptible power supply of claim 29, wherein the power cabinet is configured to receive a plurality of power modules, each having an associated power module connection assembly for slidably receiving the respective power module in the power cabinet.

31. The uninterruptible power supply of claim 27, further comprising a plurality of inductors, electrically coupled to the electrical connection sections of the second ends of ones of the connector members, positioned below the power module connection assembly and the power module and a cooling fan positioned below the inductors that provides cooling for the inductors and for the power module connection assembly.

32. The uninterruptible power supply of claim 27, wherein the cam member includes a lockout feature extending therefrom that impedes closure of a front panel of the power cabinet when the cam member is not in the second position.

33. The uninterruptible power supply of claim 27, wherein the channel is configured to receive the mating connector bars between the cam member and corresponding ones of the first ends of the connector members.

34. The uninterruptible power supply of claim 27, wherein the power module connection assembly is positioned between the power cabinet and the power module.

35. An uninterruptible power supply, comprising:
a power cabinet;
a power module removably coupled to the power cabinet; and
a power module connection assembly positioned between the power cabinet and the power module that couples the power module to the power cabinet, the power module connection assembly, comprising:
a longitudinally extending channel member that includes a first end of each of a plurality of connector members at longitudinally spaced positions in a sidewall thereof, each of the first ends having a face exposed to an interior channel of the channel member, the connector members having an electrical connection section on a second end of the connector members, the second end being displaced from the first end;
a longitudinally extending cam member positioned in the interior channel of the channel member, the cam member being rotatably movable within the interior channel from a first position wherein a plurality of mating connector bars extending from the power module are received in the interior channel of the channel member between the cam member and the first ends of corresponding ones of the connector members to a second position to press the mating connector bars and the first ends of the connector members together and wherein the power module connection assembly provides an electrical connection between the power cabinet and the power module when the cam is positioned in the interior channel in the second position.

* * * * *

UNITED STATES PATENT AND TRADEMARK OFFICE
CERTIFICATE OF CORRECTION

| | |
|---|---|
| PATENT NO. | : 7,633,759 B2 |
| APPLICATION NO. | : 11/561458 |
| DATED | : December 15, 2009 |
| INVENTOR(S) | : Tracy et al. |

It is certified that error appears in the above-identified patent and that said Letters Patent is hereby corrected as shown below:

In the Claims:

Column 16, Claim 20, Line 62: Please delete "A power module connection"

Signed and Sealed this

Thirtieth Day of March, 2010

David J. Kappos
*Director of the United States Patent and Trademark Office*